(12) United States Patent
Lacaux et al.

(10) Patent No.: US 11,794,913 B2
(45) Date of Patent: Oct. 24, 2023

(54) INTEGRATED ELECTRIC PROPULSION UNIT

(71) Applicant: The Boeing Company, Chicago, IL (US)

(72) Inventors: Frederic Lacaux, Woodinville, WA (US); Kamiar J. Karimi, Kirkland, WA (US); Eugene V. Solodovnik, Lake Stevens, WA (US); Aaron J. Kutzmann, Long Beach, CA (US); Patrick R. Darmstadt, Claymont, DE (US); Mary E. Beckman, West Chester, PA (US); Alejandro Silva, Rancho Santa Margarita, CA (US); Nicholas J. Silveri, Long Beach, CA (US); Esther S. Zidovetzki, Venice, CA (US)

(73) Assignee: The Boeing Company, Arlington, VA (US)

( * ) Notice: Subject to any disclaimer, the term of this patent is extended or adjusted under 35 U.S.C. 154(b) by 136 days.

(21) Appl. No.: 17/378,290

(22) Filed: Jul. 16, 2021

(65) Prior Publication Data
US 2022/0119121 A1 Apr. 21, 2022

Related U.S. Application Data

(60) Provisional application No. 63/094,295, filed on Oct. 20, 2020.

(51) Int. Cl.
*B64D 27/24* (2006.01)
*H02K 11/33* (2016.01)
(Continued)

(52) U.S. Cl.
CPC .............. *B64D 27/24* (2013.01); *B60L 50/60* (2019.02); *B64C 11/06* (2013.01); *B64C 11/303* (2013.01);
(Continued)

(58) Field of Classification Search
CPC .... B64D 27/24; B64D 33/08; B64D 2221/00; B64D 31/06; B64D 35/02; B60L 50/60;
(Continued)

(56) References Cited

U.S. PATENT DOCUMENTS 2,986,222 A   5/1961   Biermann
4,648,798 A   3/1987   Voisard
(Continued)

FOREIGN PATENT DOCUMENTS

DE   102013101084 A1   8/2014
WO   20200115416 A1   6/2020
(Continued)

OTHER PUBLICATIONS

GB-2574689-A (Year: 2019).*
(Continued)

*Primary Examiner* — Tulsidas C Patel
*Assistant Examiner* — Joshua Kiel M Rodriguez
(74) *Attorney, Agent, or Firm* — Ostrager Chong Flaherty & Broitman P.C.

(57) ABSTRACT

An electric propulsion unit comprising a housing, an AC motor, a beta rod, a propeller, a governor, an inverter, and a controller. The AC motor is disposed within the housing and includes bearings supported inside the housing, a hollow motor shaft rotatably coupled to the housing by the bearings, a stator which is supported by the housing, and a rotor which is mounted to the hollow motor shaft. The beta rod is axially translatable inside the hollow motor shaft. The propeller is mechanically coupled to the hollow motor shaft. The propeller includes propeller blades having an adjustable pitch angle which depends on an axial position of the beta rod. The governor is configured to adjust a pitch angle of the propeller blades by actuating axial translation of the beta (Continued)

rod. The controller is disposed inside the housing and configured to control the pitch angle of the propeller blades.

19 Claims, 14 Drawing Sheets

(51) Int. Cl.
| | |
|---|---|
| *B60L 50/60* | (2019.01) |
| *H02K 5/20* | (2006.01) |
| *B64C 11/16* | (2006.01) |
| *B64C 11/30* | (2006.01) |
| *B64D 33/08* | (2006.01) |
| *H02K 5/15* | (2006.01) |
| *H02K 7/08* | (2006.01) |
| *H02K 7/116* | (2006.01) |
| *H02K 9/19* | (2006.01) |
| *H02K 11/00* | (2016.01) |
| *H02K 11/02* | (2016.01) |
| *H03H 1/00* | (2006.01) |
| *B64C 11/06* | (2006.01) |

(52) U.S. Cl.
CPC ............... *B64D 33/08* (2013.01); *H02K 5/15* (2013.01); *H02K 5/203* (2021.01); *H02K 7/083* (2013.01); *H02K 7/116* (2013.01); *H02K 9/19* (2013.01); *H02K 11/0094* (2013.01); *H02K 11/02* (2013.01); *H02K 11/33* (2016.01); *H03H 1/0007* (2013.01); *B60L 2200/10* (2013.01); *B64D 2221/00* (2013.01); *H02K 2205/03* (2013.01)

(58) Field of Classification Search
CPC ................. B60L 50/50; B60L 2200/10; B60L 2240/545; B60L 58/10; B60L 58/24; B60L 2240/425; B60L 2240/525; B60L 2250/24; B60L 3/0092; B60L 15/20; B64C 11/16; B64C 11/303; B64C 11/38; H02K 5/15; H02K 5/20; H02K 5/203; H02K 7/083; H02K 7/116; H02K 9/19; H02K 11/0094; H02K 11/02; H02K 11/33; H02K 2205/03; H02K 7/14; H02K 1/20; H02K 3/50; H02K 5/04; H02K 7/003; H02K 16/00; H03H 1/0007; Y02T 10/64; Y02T 10/70; Y02T 10/72; Y02T 50/40; Y02T 50/60; H02P 27/06; H02J 7/0063

See application file for complete search history.

(56) References Cited

U.S. PATENT DOCUMENTS

| | | | |
|---|---|---|---|
| 5,363,002 A | 11/1994 | Herndon et al. | |
| 6,443,035 B1 | 9/2002 | Scardullo | |
| 9,225,208 B2 | 12/2015 | Downing et al. | |
| 9,994,305 B1* | 6/2018 | Moldovan | B64C 31/024 |
| 2003/0154949 A1* | 8/2003 | Niimi | B64C 11/38 |
| | | | 123/196 R |
| 2006/0249332 A1* | 11/2006 | Bruce | F01D 25/20 |
| | | | 60/39.08 |
| 2007/0246635 A1* | 10/2007 | Nakajima | B60K 6/26 |
| | | | 248/637 |
| 2009/0023306 A1* | 1/2009 | Korich | B60L 58/18 |
| | | | 439/34 |
| 2010/0038473 A1* | 2/2010 | Schneider | F16F 15/134 |
| | | | 184/6.12 |
| 2012/0274158 A1* | 11/2012 | Chun | B60L 3/0061 |
| | | | 310/53 |
| 2015/0022245 A1 | 1/2015 | Gao et al. | |
| 2016/0164378 A1* | 6/2016 | Gauthier | H02K 1/32 |
| | | | 310/54 |
| 2019/0315476 A1* | 10/2019 | Lawrence | H02K 11/33 |

FOREIGN PATENT DOCUMENTS

| | | |
|---|---|---|
| WO | 20200115417 A1 | 6/2020 |
| WO | 20200115418 A1 | 6/2020 |

OTHER PUBLICATIONS

WO-2020115417-A1 (Year: 2020).*
WO-2020115418-A1 (Year: 2020).*
Extended European Search Report (EESR) dated Feb. 28, 2022, in European Patent Application No. 21200977.3 (European counterpart of the instant patent application).

* cited by examiner

INTEGRATED ELECTRIC PROPULSION UNIT

BACKGROUND

This disclosure generally relates to electric propulsion units for aircraft. Some aircraft have electrically powered propulsion systems (hereinafter "electric aircraft"). In such aircraft, electric motors convert electrical power into mechanical power for use by the propulsion system. For example, an electric motor may turn one or more propellers on the aircraft to provide thrust. An electric aircraft may take various forms. For example, the electric aircraft may be an aircraft, a rotorcraft, a helicopter, a quadcopter, an unmanned aerial vehicle, or some other suitable type of aircraft.

A typical electrical propulsion solution relies on discrete federated components assembled together to create an electric propulsion system. As used herein, the modifier "federated" as applied to components of an assembly means that the components were designed independently from each other. The motor and inverter are federated components requiring dedicated mechanical structures, dedicated cooling circuits, and complex electrical and control interfaces. Inverters need to be in close proximity to the motor in a nacelle environment. Mechanical installation of the inverter and motor is a challenging task due to the small nacelle volume and installation constraints with routing of cooling channels, heat exchanger/air ducting, electrical wires, and control wires.

The conventional solution is dominated by separated inverters, motor, and transmission elements with extensive electric and cooling interfaces in between. Most of the electric propulsion components are separate entities— electric motors, power electronics, transmission, and battery— packaged much like a conventional turbine propulsion system. Trying to integrate individual electrified driveline elements is complex, costly, and time consuming. An electric propulsion system is a complex system posing significant integration problems within the nacelle and aircraft fuselage. The development of an optimized integrated solution to mechanically integrate components inside a nacelle would reduce weight and cost.

SUMMARY

The subject matter disclosed in some detail below is directed to an integrated electric propulsion unit having reduced weight and cost as compared to aircraft propulsion systems consisting of federated components. The system includes a simplified cooling system with a single circuit for all components (motor, inverter, thrust bearing, governor, etc.) housed inside a nacelle. The system design enables simplified integration of electrical components, a rationalized number of electrical connections, simplified electromagnetic interference (EMI) filtering, a simplified electrical harness, and a reduced number of power distribution panels. The propulsion control system is also integrated to reduce the number of controllers and simplify control harness design.

In the context of the fluid transport systems described hereinafter, the term "channel" means a hollow body comprising a conduit for guiding the flow of fluid from one opening at one end of the conduit to another opening at the other end of the conduit. The opening where fluid enters the conduit is referred to herein as an "inlet"; the opening where fluid exits the conduit is referred to herein as an "outlet". Examples of channels disclosed herein include pipes, tubes, cold plates, cooling jackets, and internal passageways in solid bodies. In the context of the motor controllers described hereinafter, the term "channel" refers to an inverter consisting of a set of power switches controlled by an inverter controller. For example, a motor controller having three inverters which provide phased AC power to the same motor is described as having three channels.

Although various embodiments of an integrated electric propulsion unit for an aircraft will be described in some detail below, one or more of those embodiments may be characterized by one or more of the following aspects.

One aspect of the subject matter disclosed in detail below is an electric propulsion unit comprising: a housing; an AC motor disposed within the housing and comprising a plurality of bearings supported inside the housing, a hollow motor shaft rotatably coupled to the housing by the plurality of bearings, a stator which is supported by the housing, and a rotor which is mounted to the hollow motor shaft; a beta rod which is axially translatable inside the hollow motor shaft; a propeller mechanically coupled to the hollow motor shaft, the propeller comprising propeller blades having an adjustable pitch angle which depends on an axial position of the beta rod; a governor configured to adjust a pitch angle of the propeller blades by actuating axial translation of the beta rod; an inverter disposed within the housing and connected to receive DC power for conversion into AC power; and a controller disposed inside the housing. The controller is configured to perform operations comprising: controlling operation of the inverter; and controlling the pitch angle of the propeller blades.

Another aspect of the subject matter disclosed in detail below is an electric propulsion unit comprising: a housing; an AC motor disposed within the housing and comprising a plurality of bearings supported inside the housing, a motor shaft rotatably coupled to the housing by the plurality of bearings, a stator which is supported by the housing, and a rotor which is mounted to the motor shaft; an inverter disposed within the housing and connected to receive DC power for conversion into AC power; a controller disposed inside the housing and configured to control operation of the inverter; and a cooling circuit configured to guide a flow of circulating liquid. The cooling circuit comprises: a sump mounted to the housing; a cooling pump mounted to the housing, geared to the motor shaft, and in fluid communication with the sump; and a cooling channel disposed inside the housing and connected to guide the circulating liquid from the cooling pump along a flow path toward the sump. The cooling circuit typically also includes a heat exchanger.

A further aspect of the subject matter disclosed in detail below is an electric propulsion system comprising a first battery configured to generate DC power, a first DC power input line connected to the first battery, and an electric propulsion unit connected to the first DC power input line. The electric propulsion unit comprises: a housing; an AC motor disposed within the housing and comprising a plurality of bearings supported inside the housing, a motor shaft rotatably coupled to the housing by the plurality of bearings, a stator which is supported by the housing, and a rotor which is mounted to the motor shaft; a propeller mechanically coupled to the motor shaft; a first electromagnetic interference filter disposed within the housing and connected to receive DC power from the first battery via the first DC power input line; a first DC busbar disposed within the housing and connected to the first electromagnetic interference filter; a first plurality of inverters disposed within the housing, each inverter of the first plurality of inverters being connected to the first DC busbar; and a controller disposed inside the housing and configured to control operation of the first plurality of inverters.

Yet another aspect of the subject matter disclosed in detail below is an electric propulsion unit comprising: a housing; an AC motor disposed within the housing and comprising a plurality of bearings supported inside the housing, a motor shaft rotatably coupled to the housing by the plurality of bearings and having an axis of rotation, a stator which is supported by the housing, and a rotor which is mounted to the motor shaft; a main drive gear mounted to a forward end of the motor shaft and having teeth; a propeller comprising a hollow propeller shaft having an axis of rotation which is offset from the axis of rotation of the motor shaft and propeller blades having an adjustable pitch angle; a beta rod which is axially translatable inside the hollow propeller shaft; a governor configured to adjust a pitch angle of the propeller blades by actuating axial translation of the beta rod; a propeller shaft drive gear mounted to the hollow propeller shaft and having teeth intermeshed with the teeth of the main drive gear; a plurality of power modules disposed radially outward from the stator; and a controller disposed inside the housing. The controller is configured to perform operations comprising: controlling operation of the plurality of power modules; and controlling the pitch angle of the propeller blades.

A further aspect of the subject matter disclosed in detail below is an electric propulsion unit comprising: a housing; first and second pluralities of bearings supported inside the housing; a main driveline shaft supported by the first and second pluralities of bearings supported inside the housing; first and second hollow motor shafts surrounding respective sections of the hollow main driveline shaft; first and second pairs of mechanical coupling devices which respectively selectively couple the first and second hollow motor shafts to the main driveline shaft; first and second rotors respectively mounted to the first and second hollow motor shafts; first and second stators supported inside the housing and disposed radially outward of the first and second rotors respectively; and a propeller mechanically coupled to the main driveline shaft; and a controller disposed inside the housing and configured to selectively activate one pair of mechanical coupling devices to decouple one hollow motor shaft from the main driveline shaft.

Other aspects of an integrated electric propulsion unit for an aircraft are disclosed below.

BRIEF DESCRIPTION OF THE DRAWINGS

The features, functions and advantages discussed in the preceding section may be achieved independently in various embodiments or may be combined in yet other embodiments. Various embodiments will be hereinafter described with reference to drawings for the purpose of illustrating the above-described and other aspects.

Reference will hereinafter be made to the drawings in which similar elements in different drawings bear the same reference numerals.

DETAILED DESCRIPTION

Illustrative embodiments of an integrated electric propulsion unit for an aircraft are described in some detail below. However, not all features of an actual implementation are described in this specification. A person skilled in the art will appreciate that in the development of any such embodiment, numerous implementation-specific decisions must be made to achieve the developer's specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

For the purpose of illustration, a system for allocating load power drawn from multiple batteries for powering propulsion of an electric aircraft is described below. However, the technology proposed herein is not limited in its application to aircraft and may also be applied in propulsion of other types of electric vehicles, such as automobiles, industrial trucks, and trains.

Figure 1:
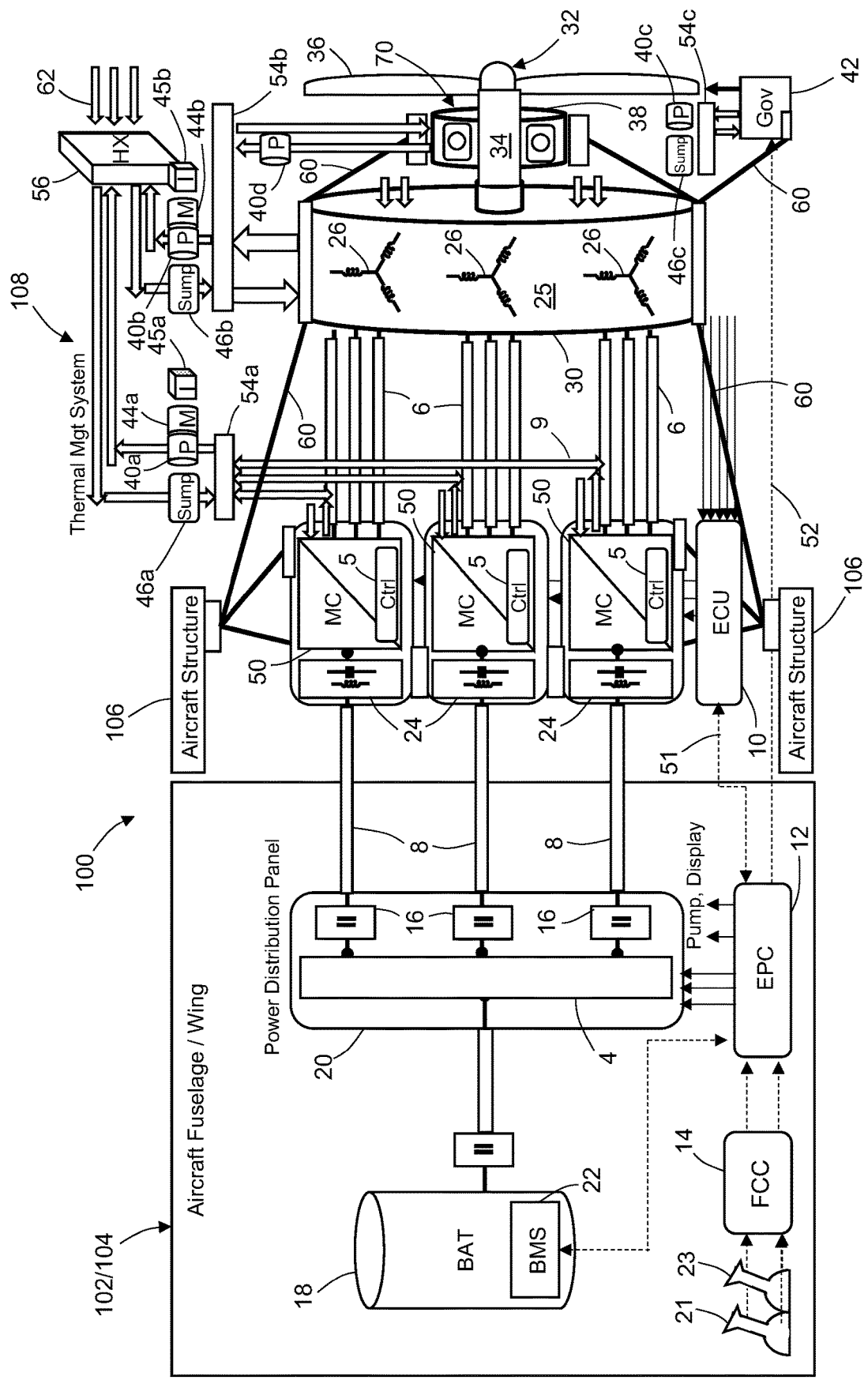
FIG. 1 is a diagram showing an overview of an electric propulsion unit with federated mechanical, cooling, and electrical/control components.

FIG. 1 is a diagram identifying components of a typical electric propulsion unit 100 with federated mechanical, cooling, and electrical/control components (hereinafter "federated EPU 100"). The federated EPU 100 is formed in part by a multi-channel motor controller (MC) that converts DC power to AC power. Each channel of the motor controller comprises a respective inverter 50 controlled by a respective inverter controller 5. Each inverter 50 is preceded by a respective electromagnetic interference filter 24 (and possibly other front-end circuitry). The federated EPU 100 further includes an AC motor that receives AC power from inverters 50 via pluralities or sets of AC power lines 6. The federated EPU 100 also includes a propeller 32 which is driven to rotate by AC motor 30. The propeller 32 includes a propeller shaft 34 which is mechanically coupled to the output shaft of the AC motor 30 and a plurality of propeller blades 36. The propeller shaft 34 is coupled to a thrust bearing 38 to form a thrust bearing/propeller shaft assembly 70. The federated EPU 100 further includes a governor 42

(a.k.a. propeller governor) which is configured to maintain a constant speed of rotation of the propeller 32 by varying the pitch angle (hereinafter "pitch") of the propeller blades 36. Hydraulic governors accomplish this by using a hydraulic valve to control the flow of engine oil through hydraulic mechanisms in the propeller 32. A controller incorporated in the governor is configured to control the flow of engine oil through the hydraulic valve (not shown in FIG. 1). When a decrease in blade pitch is wanted, the hydraulic valve is opened and the pump 40c (in conjunction with a third manifold 54c and a sump 46c) boosts oil pressure to provide quick and positive response by the propeller 32. Depending on its position, the hydraulic valve will direct oil flow to the propeller (increasing pitch), allow flow back from the propeller (decreasing pitch), or take a neutral position with no oil flow (constant pitch) in well-known manner.

In the example shown in FIG. 1, the inverters 50 form three motor controller channels for providing AC current to respective sets of star-connected windings 26 (hereinafter "motor stars 26") in the stator 25 of AC motor 30. Each inverter 50 comprises a respective set of power switches that is cooled by liquid coolant provided via respective cooling pipes 9 which connect to a manifold 54a. The power switches of respective inverters 50 are electrically connected to respective sets of stator windings in AC motor 30. The inverters 50 further include sensors (not shown in FIG. 1) which measure the voltages and currents of the AC power signals output by the inverters 50, which sensor data is fed back to the respective inverter controllers 5. The operation of inverters is controlled by the inverter controllers 5. More specifically, the switching states of each set of power switches (e.g., MOSFETs) are controlled by a respective inverter controller 5 which sends gate drive signals to the gates of the semiconductor power switches. In this manner, the inverters 50 may be operated with different phases to convert DC power into multi-phase AC power for the AC motor 30. In the example depicted in FIG. 1, the AC motor 30 is a 3×3-phase AC motor. The controllers 5 respectively control the operation (switching) of inverters 50.

In the system depicted in FIG. 1, the HVDC power source is a battery 18. For example, the battery 18 may include a multiplicity of battery modules arranged in parallel or series across positive and negative busbars to form a battery pack. Each battery module is a parallel/series arrangement of individual cells (not shown in FIG. 1). Each battery module may be monitored by an associated module monitoring unit (not shown in FIG. 1). The HVDC power source also includes a battery management system 22 which is configured to manage operation of the battery 18. Each module monitoring unit incorporated in the battery 18 communicates sensor data representing virtual cell voltage and individual cell temperature to the battery management system 22. The battery management system 22 also receives data from current sensors (not shown in FIG. 1). The system further includes a DC voltage conversion subsystem (not shown in FIG. 1) that is configured to receive high-voltage DC power from battery 18 via a battery contactor and convert that high-voltage DC power to low-voltage DC power for use in other (non-propulsion) components in the system or broader vehicle platform. The system depicted in FIG. 1 further includes a power distribution panel 20. The power distribution panel 20 comprises a HVDC bus 4 that is connected to DC power input lines 8 via respective bus contactors 16. The DC power input lines 8 carry HVDC power from the DC voltage conversion subsystem to respective channels of the inverters 50. The battery 18, DC voltage conversion subsystem, and power distribution panel 20 may be installed in the fuselage 102 (or potentially in the wing) while the DC power input lines 8 are routed through wing 104. Routing of individual power wires and control wires to individual inverters is difficult due to space and bending radius constraints. Additional power distribution panels are required to split battery output in multiple channels to accommodate multiple inverter inputs or to accommodate additional power supplies such as additional batteries, generators, or fuel cells.

The federated EPU 100 further includes a thermal management system 108 which is configured to cool inverters 50 and cool and lubricate motor as well as the thrust bearing/propeller shaft assembly 70. The thermal management system 108 includes a heat exchanger 56 that receives cooling air 62 (indicated by leftward-pointing arrows in FIG. 1) as the aircraft is being propelled forward. The heat exchanger 56 is configured such that the cooling air 62 extracts heat from liquid coolant returned from the inverters 50, motor 30, and thrust bearing/propeller shaft assembly 70 via independent cooling circuits. In the example depicted in FIG. 1, the cooling circuits include dedicated federated pumps 40a-40d and sumps 46a-46c.

More specifically, the cooling circuit for inverters 50 includes a pump 40a and a sump 46a which are in fluid communication (via cooling pipes or channels) with the heat exchanger 56 and a first manifold 54a. The liquid coolant circulates from the first manifold 54a through respective cold plates inside the respective inverters 50 (which plates are thermally coupled to cool the power switches in each inverter), and then back to the first manifold 54a. The pump 40a is driven by a motor 44a which receives AC power from an inverter 45a.

The cooling/lubrication circuit for motor 30 includes a pump 40b and a sump 46b which are in fluid communication (via cooling/lubrication pipes or channels) with the heat exchanger 56 and a second manifold 54b. The liquid coolant/lubricant circulates from the second manifold 54b through the stator 25 and through the thrust bearing/propeller shaft assembly 70, and then back to the second manifold 54b via cooling pipes or channels. The pump 40b is driven by a motor 44b which receives AC power from an inverter 45b.

Cooling/lubrication pipes need to be routed to each inverter and motor star from the two different cooling circuits. The numerosity of the cooling pipes and routing with two different circuit types create complexity and integration challenges. Installation of dedicated pumps and sumps for each circuit add complexity and challenges for nacelle integration. The thrust bearing/propeller shaft assembly 70 and governor 42 are federated components requiring dedicated mechanical structures and cooling/lubrication circuits. The thrust bearing 38 decouples the motor 30 mechanically from the propeller 32. The thrust bearing 38 requires a lubrication system that can be connected in parallel with the motor cooling system and an additional dedicated scavenging pump 40d. Typically, the governor 42 is used to control propeller pitch with a hydraulic actuator/beta rod system. This system requires a high-pressure oil system provided by an additional pump 40c and sump 46c.

As seen in FIG. 1, the system further includes an engine control unit 10 (hereinafter "ECU 10"), which is installed inside the engine nacelle. The ECU 10 interfaces with the inverter controllers 5 inside the inverters 50. The inverter controllers 5 are communicatively coupled to receive control signals from ECU 10 and send feedback signals to ECU 10, which performs a role of supervision and coordination for all inverter controllers 5. The ECU 10 is also communicatively coupled to an electric propulsion controller 12 (hereinafter "EPC 12") which controls the overall operation of the aircraft electric propulsion motor drive system depicted in FIG. 1.

The EPC 12 receives commands from a flight control computer 14, which in turn receives pilot thrust and pitch inputs from a thrust control lever 21 and pitch control lever 23 located on the flight deck. The EPC 12 also receives a signal which is proportional to the speed of propeller rotation from a speed and position sensor (not shown in FIG. 1). In addition, the EPC 12 receives signals representing measured currents from current sensors (not shown in FIG. 1). The EPC 12 sends instructions to the engine control unit 10 for controlling operation of the inverters based on information from sensors and pilot inputs. The EPC 12 also interfaces with the battery management system 22. The EPC 12 is configured to send digital torque command signals 51 to the engine control unit and analog pitch command signals 52 (e.g., feathering commands) to the governor 42. The EPC 12 is also configured to control the states of the battery contactor 48 and the bus contactors 16 on the power distribution panel 20.

In accordance with the architecture shown in FIG. 1, the system is controlled by the EPC 12. The EPC 12 accepts inputs from the pilot through the thrust and pitch control levers 21 and 23. For optimal propulsion system operation, it is necessary that propeller speed be maintained constant regardless of thrust and pitch commands. The EPC 12 receives sensor data indicating the propeller speed from the speed sensor, compares the measured speed with a reference speed signal, and generates a torque command which is sent to the ECU 10.

In a typical motor controller for an EPU, multiple inverters are used and require individual DC power lines connected to the power distribution panel inside the fuselage 102 and routed through the wing 104 to inside the nacelle. The AC power lines 6 need to be routed inside the nacelle from each inverter 50 to each motor star 26. All DC and AC power lines are susceptible to create electromagnetic interference (EMI) and require EMI filters 24 and/or shielding. Power distribution panels are relatively complex and include a dedicated power channel for each inverter with a respective contactor and fuse devices and protection coordination. Electrical integration is difficult with multiple inverters feeding from the same HVDC bus 4, requiring development of stringent power quality and interaction requirements to limit cross-talk and circulating current between inverters. The system weight is impacted by additional filters and countermeasures. Also, the AC motor 30 and inverters 50 have their own housings, adding significant weight and cost. In addition, control functions need to communicate with multiple inverters. The local ECU 10 is required in the nacelle to multiplex information from the EPC 12 or flight control computer 14 to the inverter controllers 5.

To mechanically install all of the aforementioned federated components in the nacelle, a web mechanical structure (hereinafter "space frame 60") needs to be developed to interconnect all the components together and interface the complete assembly with the aircraft primary structure 106 (see FIG. 1). The space frame 60 and the individual component structures need to be designed with proper resonance modes and damping dependent on propeller and airframe characteristics. Accordingly, the design process is difficult due to separate design of each individual component, system modeling, and iteration to convergence. Also, the federated components integration approach is accompanied by significant weight penalties due to the multiple housings and additional web structure.

Figure 2:
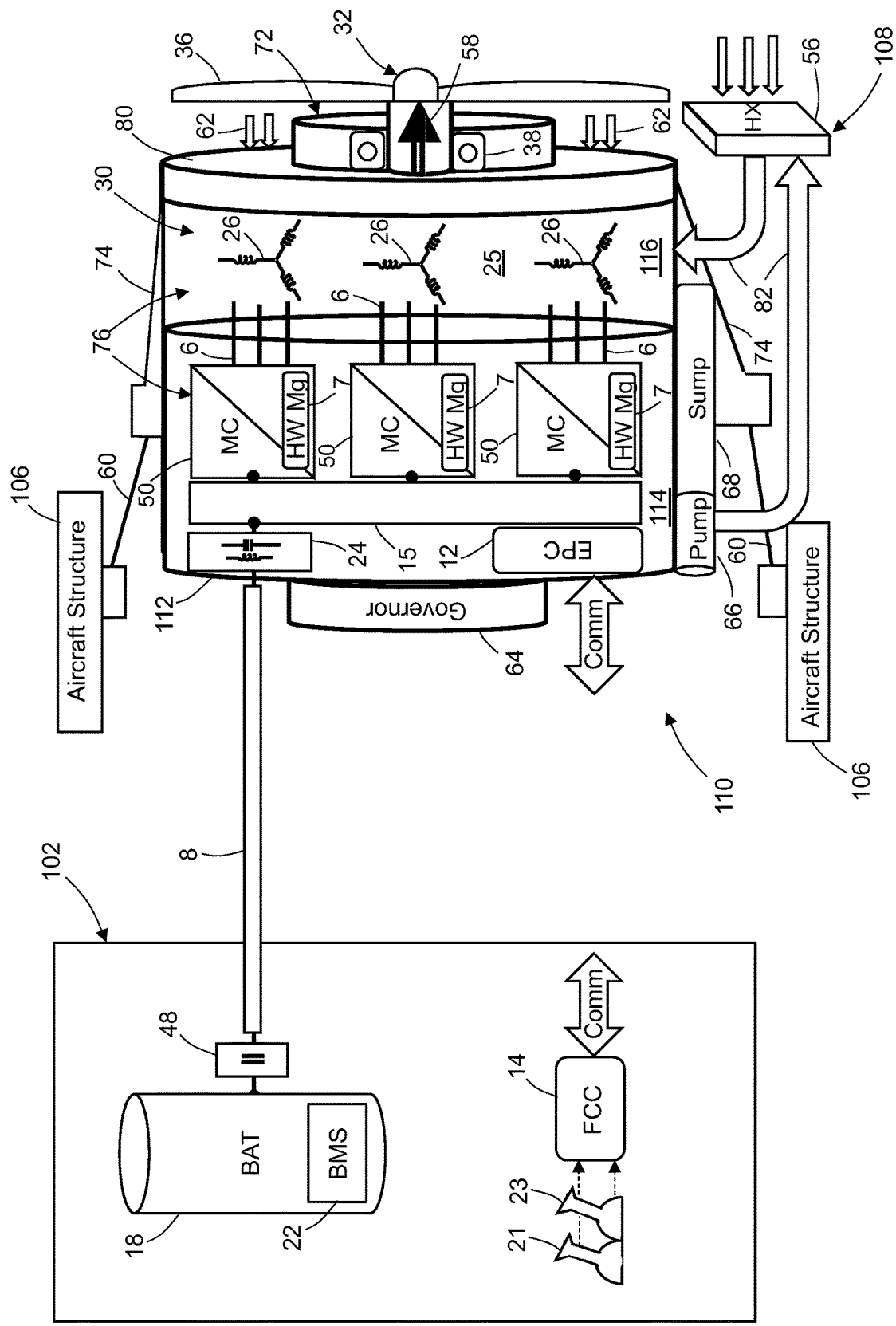
FIG. 2 is a diagram showing an overview of an electric propulsion unit with mechanical, cooling, and electrical/control integration in accordance with one embodiment.

FIG. 2 is a diagram showing an overview of an integrated EPU 110 with mechanical, cooling, and electrical/control integration in accordance with one embodiment. As used herein, the modifier "integrated" as applied to components of an assembly means that the components were designed in conjunction to optimize a set of parameters. The concept proposed herein involves integration into a single package of a motor 30, inverters 50 with respective hardware-logic inverter controllers 7 (hereinafter "hardware managers 7"), a thrust bearing/transmission/propeller shaft assembly 72 (hereinafter "TB/T/PS 72"), and a governor 64 to create the integrated EPU 110. Rather than trying to "crowbar" (cram or tightly pack) systems into an existing architecture, the objective is to incorporate all power train components into a single entity to optimize weight, cost, volume integration, installation, and maintenance. The integrated EPU 110 is developed as a mono-block integrated package assembly grouping all of the electric propulsion system functions. The resulting EPU integrated package is a nacelle drop-in installation for an aircraft engine function. This plug-and-play approach combined with an integrated system enables only one unit to be installed and assembly requires only that the integrated EPU 110 be connected to the battery 18 and to the thermal management system 108. While an electric propeller-driven example is shown in FIG. 2, this concept is also applicable to electric and hybrid turbofan engines. The proposed integrated system allows the exclusion of interface components, a connector system, separate cooling circuits, and sealing. The integrated system would enable smaller, lighter packages and improve efficiency and cost. It also enables key trade-off with integrated motor design (losses, volume) and transmission design (ratio speed), cost trade-off (motor, transmission), and reduced system weight.

The integrated EPU 110 in accordance with one embodiment includes integrated motor and inverter power electronics 76 which are integrated inside an EPU housing 112. The EPU housing 112 is in turn divided into an inverter power electronics compartment 114 and a motor compartment 116. The EPC 12 is embedded in the inverter power electronics compartment 114. A single DC power input line 8 feed DC power to all inverters 50 via a common EMI filter 24 and a common low-inductance DC busbar 15 (hereinafter "common DC busbar 15") with interleaved layers of conductors/insulation. Each layer of conductors in the laminated common DC busbar 15 is connected to the EMI filter 24 and to a respective inverter of the plurality of inverters 50. The integrated EPU 110 further includes a TB/T/PS assembly 72 which is integrated with the EPU housing drive end plate 80. The governor 64 is integrated with the EPU housing back end plate (not visible in FIG. 2).

In accordance with the embodiment depicted in FIG. 2, the governor 64 is coupled to an integrated beta rod 58 which may be axially translated to change the pitch of the propeller blades 36. In addition, a geared multi-element cooling/lubrication pump 66 and an oil cooling sump 68 are integrated in the bottom of the EPU housing 112. The pump elements (described later with reference to FIG. 4) of geared multi-element cooling/lubrication pump 66 are directly geared from the main motor shaft (not shown in FIG. 2). The EPU housing 112 is used as the main structural element connecting directly to the aircraft primary structure 106.

The high integration level achievable by packaging all of the individual modules that work together into one system to form an integrated EPU 110 enables optimized weight, cost, and package size. Since functions are combined inside one housing, EPU installation in the nacelle is significantly simpler than in a federated design. The proposed highly integrated mechatronic module provides for nacelle integration and an optimal solution while minimizing interfaces with cable and fluid pipes.

The integrated EPU 110 proposed herein provides state-of-the-art transmission technology, electric motor, and power electronics in one package. The integrated EPU solution provides key optimizations compared to the federated solution for nacelle installation and aircraft components simplification: (a) optimization of integrated EPU packaging design versus individual components packaging design and integration with a space frame 60 to form an integrated mechanical mounting point 74, resulting in significant weight and cost savings; (b) installation of a complete EPU 110 directly inside the nacelle versus the state-of-the-art piecemeal approach, resulting in significant cost savings with easy installation and maintenance; (c) simplification of thermal interfaces with a single cooling line 82 from the integrated EPU 110 to the heat exchanger 56 (which is external to the integrated EPU 110), with no other interconnecting cooling/oil line inside the nacelle; (d) simplification of the electrical wiring system by not including any external AC wires between the motor 30 and inverters 50 and by providing a single DC power input line 8 to feed DC power to interleaved inverters 50 via the common DC busbar 15 inside the EPU housing 112; (e) simplification/deletion of aircraft power distribution panels with no individual power distribution unit for each inverter 50; (f) simplification of control interfaces by embedding the EPC 12 within the inverter power electronics compartment 114 to provide a simple communication interface (indicated by a pair of double-headed arrows in FIG. 2) with the flight control computer 14; (g) simplification of mechanical interfaces by providing an integrated mechanical mounting point 74 from the integrated EPU 110 to the nacelle for load transmission to the aircraft primary structure 106; (h) the opportunity to integrate a combined air cooling system between the rotor and an inverter system that surrounds the rotor (not shown in FIG. 2, but see FIGS. 7A-7D described later); and (i) the ECU function is performed by an EPC installed inside the nacelle, which provides another weight and cost saving advantage over the federated system shown in FIG. 1).

For a federated system, the motor, inverter, and transmission are developed independently and separately. The federated system is assembled by bolting components together, connected with plugs, cables and harnesses, and pipes. The assembly is tested and calibrated. In contrast, the integrated system proposed herein enables optimization of the design by using the different synergies between the different sub-assemblies and using innovative design degrees of freedom offered by the integrated package. For example, in an integrated package the transmission speed ratio can be tailored to optimize motor sizing. Also the thrust bearing/propeller shaft assembly can be optimized as an integrated system. Cooling can be optimized by mutualizing between the different assemblies. For example, a water-cooled jacket inside the motor can be removed and instead the oil transmission fluid is used for cooling, thereby merging housings to achieve a compact design.

As previously mentioned, a typical state-of-the-art electric propulsion solution relies on the installation of myriad individual components such as inverters, motor, governor, thrust bearing/propeller shaft, controllers, and auxiliary components (such as cooling pumps and cooling sumps) in the nacelle compartment. All those components are usually interconnected to a secondary web-type structure (e.g., space frame 60 in FIG. 1). The space frame 60 is connected to the aircraft primary structure 106. The multiplication of standalone components to install provides a complex solution with significant integration challenges in terms of weight and volume within the nacelle. The system interconnections with electrical wiring, cooling pipes, control harnesses, etc. are difficult to develop inside the nacelle and prone to failure. The mechanical/packaging design of the federated nacelle is suboptimal since each component has its own non-structural housing and additionally the space frame 60 is required to provide the main load path to aircraft primary structure 106. The numerous housings penalize the overall cost and weight of the federated solution. The space frame 60 needs to provide multiple attachment points and support to diverse components (inverters, controller, motor, etc.), which requires complex design and reinforcements.

Figure 3:
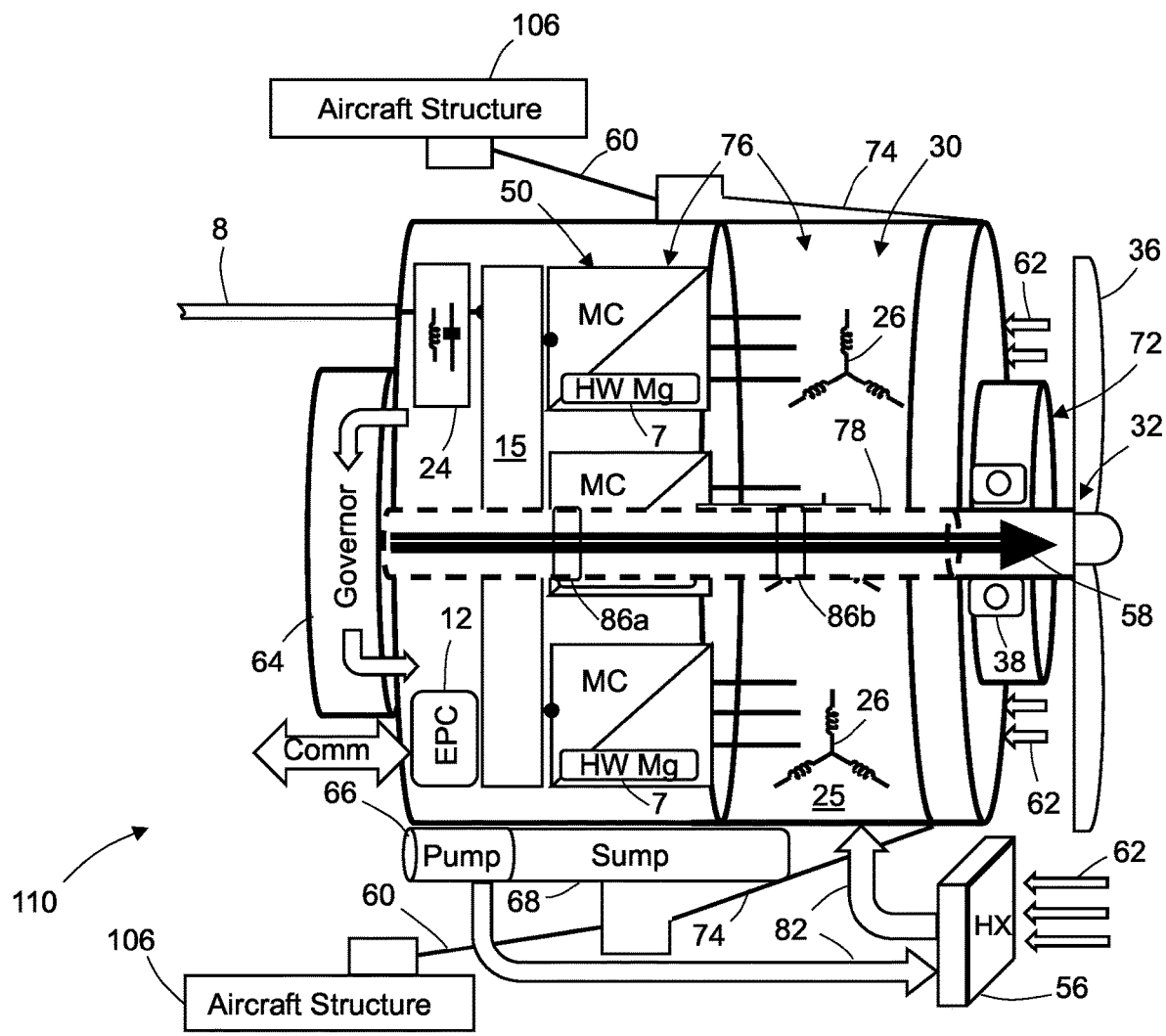
FIG. 3 is a diagram showing integration of mechanical components of an electrical propulsion unit in a single package connected to aircraft primary structure.

FIG. 3 is a diagram showing integration of mechanical components of an integrated EPU 110 in a single package connected to aircraft primary structure 106 in accordance with one embodiment. The mechanical integration enables use of the EPU housing 112 directly as the structural path to the aircraft primary structure 106, thereby reducing the overall weight compared to the state-of-the-art federated solution. Additional optimization is done to reduce the weight of the overall mechanical structure by merging all of the housings of the standalone components together into an integrated package. The EPU housing 112 may be optimally designed to vibrate with a natural frequency outside of an unwanted region that could interact with the system stimulus (propeller, airframe). EPU integration by merging all individual housings together provides an optimal solution to the system frequency design by using all available material in one central place to create a stiff robust mono-block package.

The integrated EPU 110 depicted in FIG. 3 includes a TB/T/PS assembly 72 directly integrated in the motor drive side of the EPU housing 112. The integration inside the EPU housing 112 enables the exclusion of a dedicated housing and associated support structure for the thrust bearing/propeller shaft function. The integration inside the EPU housing 112 also enables easy lubrication by integration with an internal oil system (described in more detail below). The TB/T/PS assembly 72 includes a grounding ring (not shown in FIG. 3) to provide shaft grounding and bearing current protection. Optionally the TB/T/PS assembly 72 may include a speed reducer/transmission and clutch functions between the motor 30 and propeller 32. The motor shaft can be used directly as a transmission shaft, simplifying the interface with the transmission system. More specifically, the system is designed without a quill shaft and a propeller shaft, which serve to isolate the motor from thrust, bending moments, and axial misalignment, so that the motor shaft is directly coupled to the propeller. The thrust bearing 38 can also become the motor drive side bearing, which enables the exclusion of the additional bearing required in the typical federated solution. The integration of the TB/T/PS assembly 72 enables a reduction in the number of bearings and interfaces at the system level, thereby providing weight and cost improvements compared to the state-of-the-art federated solution.

In addition, the motor stars 26 of motor 30 and the inverters 50 of the motor controller (MC) are co-localized in the EPU housing 112, which enables sharing of mechanical structure and cooling channels and easy electrical connection between motor windings and inverter phase legs. The inverter power electronics compartment 114 shown in FIG.

2 is separated from the motor 30 by a partition that allows electrical interconnection of the inverters 50 and motor stars 26. In an alternative embodiment (described below with reference to FIGS. 7A and 7D), the motor controller could be configured to surround (360 degrees) the stator 25 using the stator iron or housing as support structure and using the stator cooling channel or jacket to provide cooling to the semiconductor power switches of the inverters 50. The co-localization of inverters 50 and motor 30 also enables the exclusion of heavy additional housing and heavy high-gauge connecting AC wires. Such co-localization also enables cooling system integration between the inverters 50 and motor stars 26 and core of the stator 25. The motor 30 has multiple motor stars 26 which are distributed in respective angular positions at equal angular intervals around the circumference of the stator core. The inverter modules are distributed in a similar fashion to provide easy integration with the winding electrical connections and cooling.

The embodiment depicted in FIG. 3 also includes integrating the governor function within the integrated EPU package. The governor 64 includes a hydraulic actuator (not shown in the drawings) that is coupled with a mechanical system that includes an integrated beta rod 58 that controls the propeller blade pitch. The governor 64 is mounted to the back side of the EPU housing 112. The governor 64 is powered by hydraulic pressure produced by oil coming directly from the EPU integrated oil system (not shown in FIG. 3). The integrated beta rod 58 is disposed inside a hollow motor shaft 78 that traverses from the governor compartment through the inverter power electronics compartment 114 and motor compartment 116. The integrated beta rod 58 is supported in the hollow motor shaft 78 by inserts 86a and 86b to keep the beta rod centered inside the hollow motor shaft 78 without excessive vibration. The inserts 86a and 86b are affixed inside the hollow motor shaft and rotate therewith. However, the inserts 86a and 86b are also configured to support beta rod 58 while allowing beta rod 58 to slide axially through openings in the inserts (e.g., by means of bearings). The fluid pressure of the integrated beta rod 58 is controlled by the state of a hydraulic valve of the governor 64. This pressure in beta rod 58 moves a piston and changes the propeller blade 36 pitch in a well-known manner.

The integrated EPU concept proposed herein enables simplification of the oil circuit for lubrication and cooling by enabling sharing between the different components such as motor windings, motor bearing, inverters, thrust bearing, and governor. All of the oil distribution system is internal to the EPU housing 112 with only the heat exchanger 56 being located outside EPU housing 112, but inside the nacelle. The geared multi-element pump 66 and oil cooling sump 68 are integrated with the EPU housing 112, as well as the oil distribution circuit, manifold (plenum), and channels to the different elements.

State-of-the-art federated systems typically use a system having multiple pumps and sumps for cooling the motor and inverters, lubricating the thrust bearing, and supplying oil pressure to the governor, resulting in potentially four independent liquid systems. The numerosity of the liquid systems impacts system weight and cost adversely by duplicating numerous parts. For a typical federated system, many interconnecting pipes and tubes are required to distribute the multiple fluids at different pressures to the propulsion unit components. The installation of the multiple dedicated pumps and sumps in the nacelle for each circuit adversely impacts weight, volume, and cost. Additionally, for some components such as the motor, the internal bearing may be grease lubricated, which negatively impacts reliability and maintenance due to the complexity involved in providing multiple circuits for cooling, lubricating, and scavenging to respective components.

Figure 4:
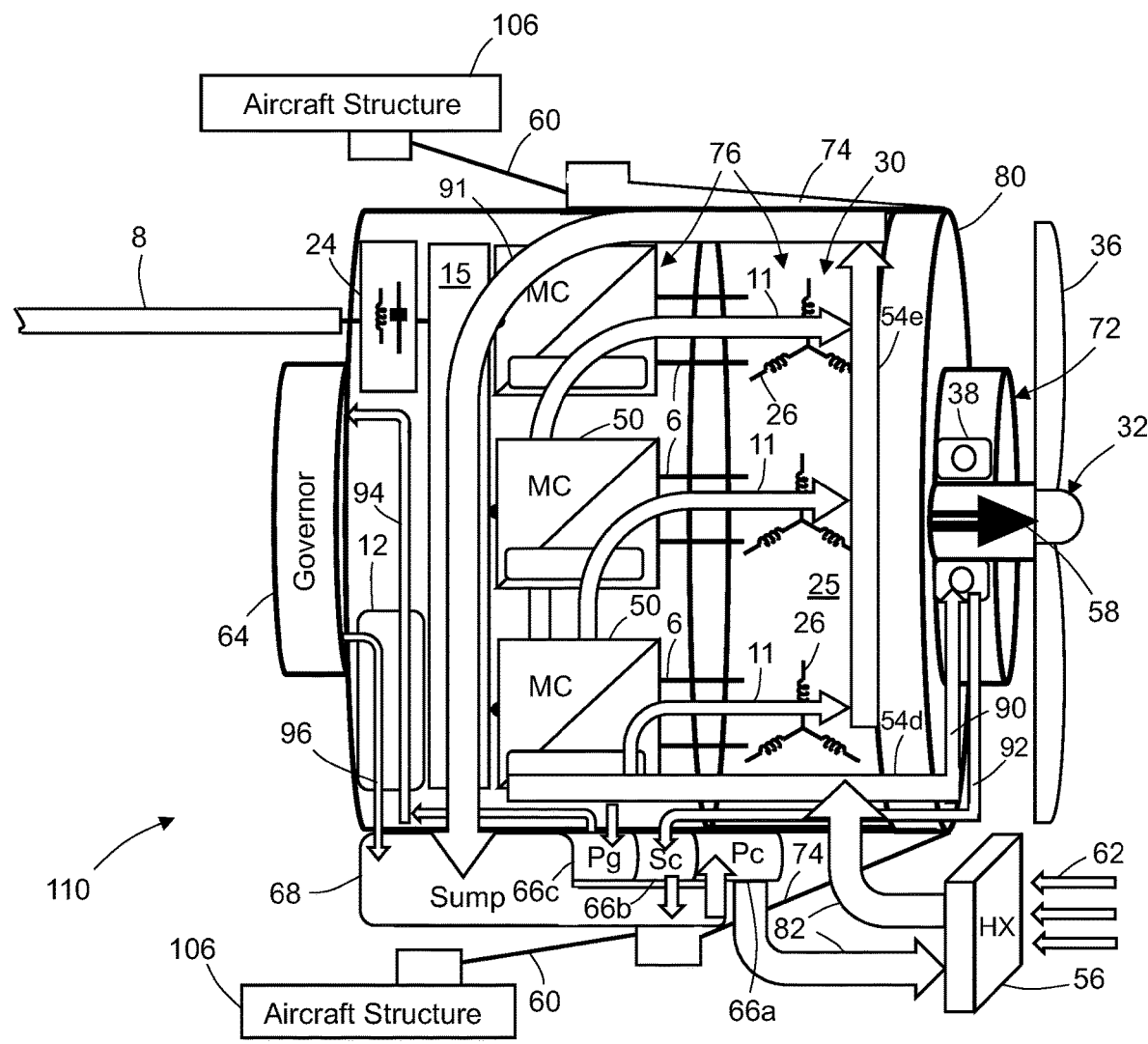
FIG. 4 is a diagram showing integration of cooling, lubrication, and governor oil components of an electrical propulsion unit into a single liquid system.

FIG. 4 is a diagram showing integration of a single liquid system for providing cooling, lubrication, and governor oil in an integrated EPU 110. The development of a highly integrated mechatronic packaging solution enables cooling synergy between the different propulsion elements sharing the cooling with proper hydraulic interfaces at the system level. The integrated EPU concept enables all subsystems for cooling or lubrication to be integrated into a single liquid system. The integrated EPU 110 has an integrated sump 68 that receives oil returned from all of the different components that require cooling, lubrication, or oil pressure. The integrated EPU 110 further incorporates an integrated geared multi-element pump which is coupled directly to the main shaft of the motor. Driving the pump from the motor shaft eliminates the drive motors and inverters that would be required for federated pumps. The integrated pump includes different elements to provide adequate flow and pressure to the different subcomponents. Channels for the flow of oil are represented by arrows in FIG. 4.

As seen in FIG. 4, the elements of the integrated geared multi-element pump include a high-flow low-pressure cooling/lubrication pump 66a (hereinafter "cooling/lubrication pump 66a"; also labeled "Pc" in FIG. 4) for supplying cooling oil in series to the inverters 50 and then to the motor 30 and in parallel to the thrust bearing 38 for lubrication. More specifically, the cooling/lubrication pump 66a draws oil from the integrated sump 68 and then pumps the oil through the heat exchanger 56 and into an internal manifold 54d. The pressurized oil then flows in parallel through the inverter/motor cooling channels 11 and through a bearing lubrication channel 90. After cooling the motor 30, the oil returns to the integrated sump 68 via an internal manifold 54e and a return channel 91.

The elements of the integrated geared multi-element pump further include a scavenging pump 66b (also labeled "Sc" in FIG. 4) that provides pressure in a bearing scavenging channel 92 to scavenge oil from the thrust bearing 38 and other motor bearings. The scavenged oil is returned from the thrust bearing 38 to the integrated sump 68 via bearing scavenging channel 92 and scavenging pump 66b.

The elements of the integrated geared multi-element pump further include a low-flow high-pressure governor pump 66c (hereinafter "governor pump 66c"; also labeled "Pg" in FIG. 4) that provides an oil pressure boost for the governor 64 for actuation of blade pitch angle adjustment. The pressurized oil flows from governor pump 66c to governor 64 via a governor pressurized oil channel 94; the oil in the governor 64 is returned to the integrated sump 68 via an oil return channel 96.

Thus, the oil distribution to multiple components (motor, inverters, bearing, and governor) is done internally to the EPU integrated package without any external oil line or pipe. The only hydraulic/oil connection required is to the external heat exchanger 56 located in the nacelle. The EPU integrated thermal/oil management system enables the use of a single pump and sump system for supplying oil for cooling or lubrication to all oil-cooled or oil-lubricated components under appropriate flow rates and pressures. Transfer tubes and internal passages are used where possible to eliminate tubing and fittings that would otherwise add weight and cost as well as be a potential leak source.

Independently designed (federated) components may also have different fluids, temperatures, and pressure requirements. Integrating the design of all the components enables the components to be compatible. The typical federated approach does not support sharing internal cooling between inverters and motor windings since such cooling requires complex and cumbersome piping and tubing between both elements. It is possible to connect a complete inverter block (three inverters) with a complete motor block (three motor stars) in series with some external oil distribution, but the result would be suboptimal thermal (high delta temperature from inverter feed to motor winding) and hydraulic (high pressure drop) performances. The co-localization of the motor and inverter elements enables sharing of the cooling between each inverter and its associated motor star in a series cooling configuration. The main cooling oil loop is split into three independent parallel paths providing cooling to each inverter/motor star combination. The inverter 50 and motor star 26 can directly share the same cooling jacket or the inverter cold plate can be connected in series with the motor star cooling path. This proposed configuration enables an optimized cooling solution with series connection of each inverter and motor channel while reducing the overall pressure drop by paralleling the three independent cooling circuits (loops).

For governor pitch actuation, an additional low flow pump element is used to boost the pressure from the main low pressure/high flow circuit to create the required high pressure (with low flow) required for the governor. By using a boost element in series with the main circuit it enable to have a small optimized element for the governor circuit. For bearing scavenging, an additional small scavenging element is used to only scavenge the bearing element compare to scavenge the full flow from the motor in a federated approach.

Moreover, by enabling sharing of cooling between the gearbox, governor, inverter, and motor, the solution proposed herein is using a single cooling system for all propulsion elements, thereby significantly simplifying the cooling system as compared to the state-of-the-art solution. Additionally the integration of gear pump and sump provide an optimized weight and volume solution.

In a typical EPU, the motor rotor can be cooled using different technology depending on the detailed motor design. However, for a high-power motor, one preferred design option is to not spray oil in the air gap between the stator and rotor since oil can cause significant hydraulic/mechanical losses. In one simple design, the rotor can be cooled by a mixture of convection and conduction cooling. More advanced designs use air flow drawn through the rotor wheel to provide cooling to the rotor magnets.

Inverter power electronics currently rely on a liquid cooling system to remove the heat generated by the semiconductor power switches, filters, and circuit boards. The semiconductor power switches are mounted to and in direct contact with a cold plate through which liquid coolant is flowing. Cooling of electronic control boards and capacitors can be challenging due to the lack of space on the cold plate and the lack of another cooling medium to drain the heat away from these components.

A typical federated design does not enable rotor air cooling within the inverter design. The inverter cold plate footprint has to accommodate all the components to enable direct contact with the cold plate, including the semiconductor power switches and DC link capacitor. The control board and driver board are usually not in contact with the cold plate and are subject to high operating temperature due to the lack of cooling. Adding an external fan or creating thermal conduction to the outside structures with housing fins would have a significant impact on the inverter design by increasing weight and cost.

Figure 5:
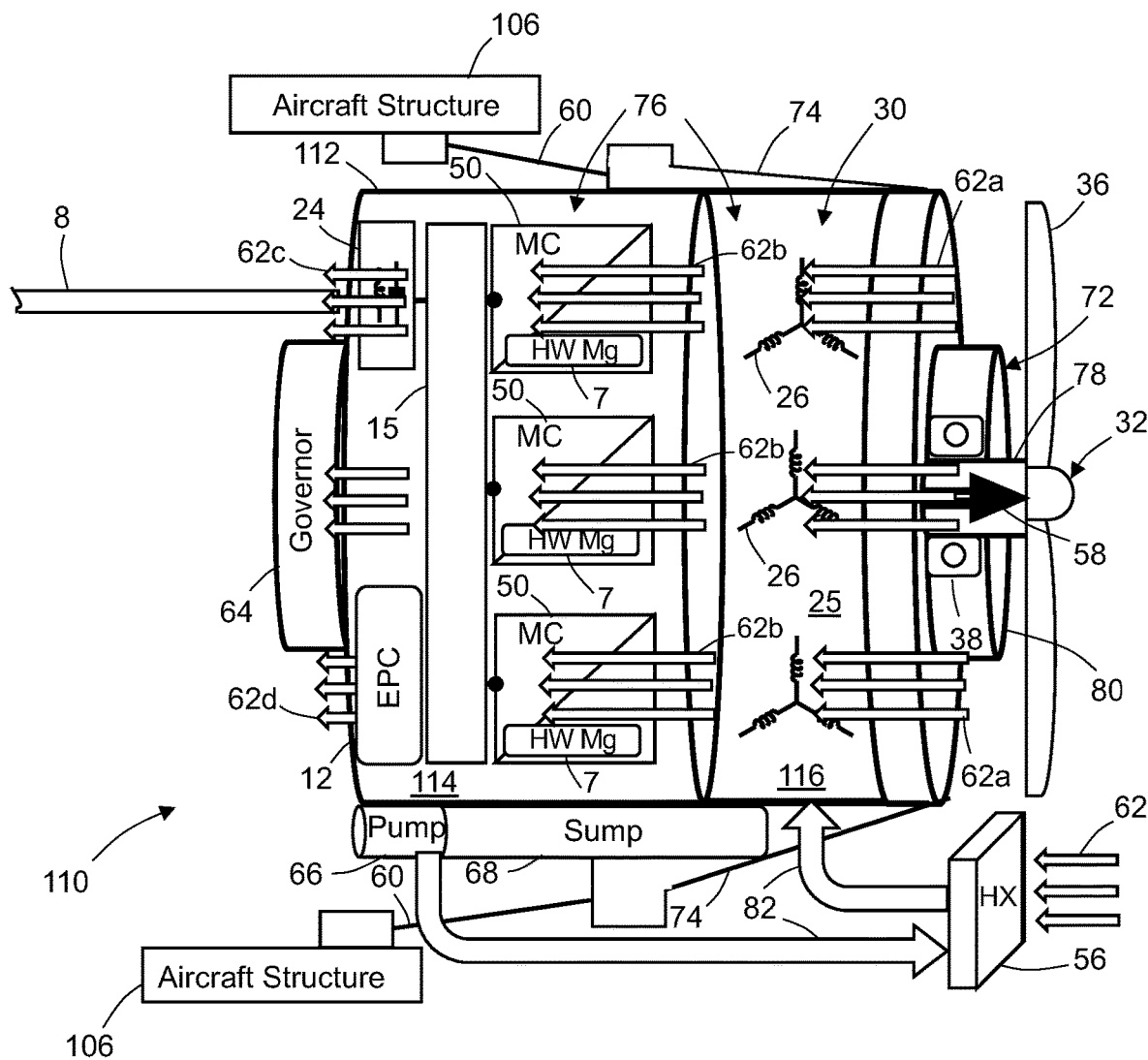
FIG. 5 is a diagram showing integrated air cooling of the motor and inverters of an electrical propulsion unit.

FIG. 5 is a diagram showing integrated air cooling of the motor 30 and inverters 50 of an integrated EPU 110. The flow of cooling air through the integrated EPU 110 is indicated by leftward-pointing arrows. The integrated EPU 110 is designed to enable the motor rotor air cooling to be routed through the inverter power electronics compartment 114 to provide cooling to components which are not in direct contact with the cold plate. The motor rotor wheel is designed with impeller capability to draw cooling air 62*a* through the rotor center. The motor front plate has a grill with air inlets to enable air to flow through the rotor inner wheel. The rotor wheel can include fins in the back of the rotor magnet to channel the air with the proper velocity and flow close to the magnet. The cooling air 62*a* drawn in the rotor wheel is used to remove heat from the magnet and limit its operating temperature.

Once the cooling air 62*b* is exiting the motor, part of it can be directly channeled into the inverter power electronics compartment 114 to cool components such as the driver board, control board, and potentially filter components such as capacitors and inductors. The use of forced-air cooling allows efficient, lightweight cooling of all electronic components not in contact with the cold plate. Alternatively, the air can be directed toward cooling fins integrated in the inverter power electronics compartment 114 to increase the convection cooling provided through this interface. Cooling air 62*c* exiting the inverters 50 cools the common EMI filter 24, while cooling air 62*d* exiting the inverters 50 cools the EPC 12.

Providing forced-air cooling to the power electronics components has the advantage that the inverters may have a compact design with liquid cooling for the semiconductor power modules and air cooling for the DC link capacitors and controller/driver board components. Air can be directly blown on those components or on a fin structure (cold plate or housing) in thermal contact with those components. The proposed compact design also enables a reduction in the inverter cold plate footprint. Thus, the integrated EPU 110 proposed herein provides significant design optimization by enabling the inverters and motor to share a liquid and air cooling system.

Figure 6:
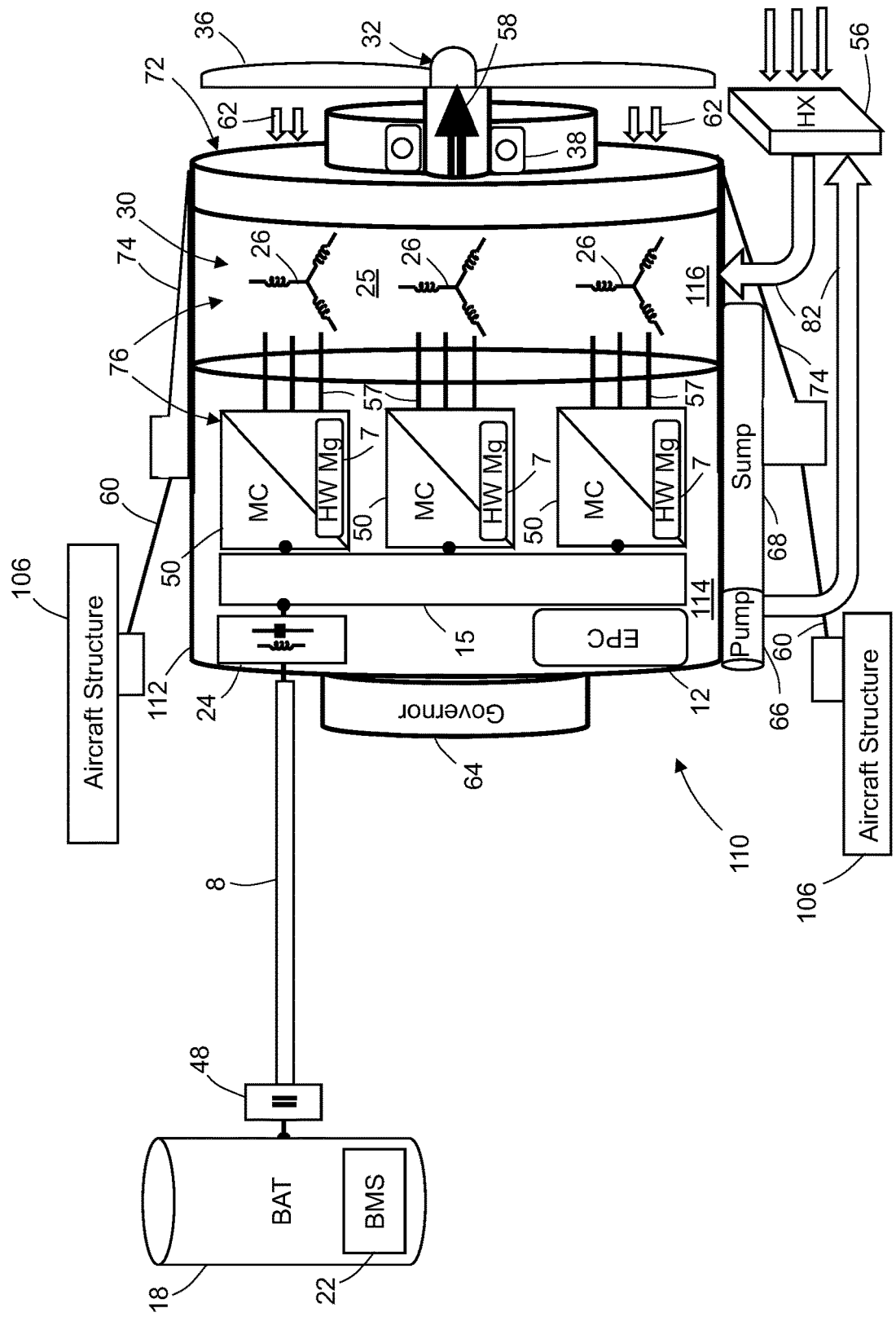
FIG. 6 is a diagram showing integration of electrical and control components of an electrical propulsion unit.

In addition, the integration of all the inverters 50 in a single package enables multiple electric synergy to optimize the power electronics design and the motor windings. FIG. 6 is a diagram showing integration of electrical and control components of an integrated EPU 110 in accordance with one embodiment. The EPU inverter integration enables having a single DC terminal for the EPU and DC power input lines 8 in a single harness between the integrated EPU 110 and the battery 18. The aircraft wiring between the battery 18 and EPU 110 is simplified by using a single DC dual (plus/minus) harness versus three DC dual harnesses. Also, the number of extra connectors on the EPU and battery is reduced. Thus, the integrated solution simplifies the DC power distribution and wiring through use of a single input and the common DC busbar 15 inside the EPU housing 112. Typically, aircraft wiring is required to be shielded for safety and EMI purposes. Using a single wiring harness makes the shielding significantly easier than with multiple wiring harnesses. Simplification of the harness and avoidance of extra connectors enables a simple integration within the aircraft, thereby saving weight, volume, and costs. The integrated approach also avoids the use of dedicated inverter power distribution and enables power to be fed directly from the battery 18 to the common busbar inside the EPU housing 112.

In addition, the co-localization of the inverters and motor avoids the need for heavy-gauge AC connecting wires. In a typical federated solution, for each inverter 50, three single-phase conductors have to be routed between the inverter and motor for each motor star 26. With a high-power propulsion motor, it is common to have multiple motor stars per inverter to realize the required power rating. This requires a high number for large-gauge wires (9 to 18) to realize the interconnection between inverters 50 and motor stars 26. The routing of those wires can be complex and costly and may significantly impact weight and volume. With the integrated EPU 110 depicted in FIG. 5, all AC wiring is rendered unnecessary and the connection between motor star windings and inverter phase legs is done directly by means of small busbars 57 in the integrated package.

In addition, AC wires in the typical federated solution are a significant contributor to EMI perturbation and motor winding over-voltage stress. AC wires are usually required to be fairly short to limit motor winding over-voltage stress and fully shielded to mitigate EMI perturbation of surrounding equipment. The integrated solution proposed herein provide an elegant solution to both issues since the connection is the shortest possible, thereby limiting the winding over-voltage, and the EMI shielding is provided by the EPU housing 112. Additionally, this type of integration enables an increase in the switching frequency of the inverter since the AC parasitic capacitance is almost zeroed out and does not limit the inverter switching. Increasing the switching frequency reduces motor rotor losses and optimizes the motor magnetic design.

In addition, the integrated package proposed herein enables optimization of filtering using interleaving and centralized filtering for EMI (see common EMI filter 24 in FIG. 6). All inverters 50 are connected to the common DC busbar 15 and share a common single DC link capacitor (not shown in FIG. 6). By using a centralized DC link capacitor shared between the three inverters, it is possible to reduce the size of the DC link capacitor required for the total number of inverter compared to the total size of three DC link capacitors for three separate inverters. All the inverters 50 are directly connected to the common DC link capacitor using the common DC busbar 15. In accordance with one proposed implementation, the common DC busbar 15 is a low-inductance laminated busbar having interleaved (alternating) layers of conductors and insulation, and the switching pattern of the inverters 50 is such that the AC power signals are interleaved in phase. This technique allows the perturbations generated by the three interleaved inverters to be reduced, which in turn enables the capacitance of the DC link capacitor to be reduced as compared to the federated approach. In the typical federated approach, the input filter for each inverter includes a differential inductor to limit potential circulating current between inverters. The integrated approach proposed herein eliminates the individual input filter inductor in each inverter, thereby saving weight/volume and providing improved efficiency. In contrast, the typical federated approach does not allow such optimization because the inverters 50 are independent from each other and it is not possible to interleave the switching patterns. Additionally, with federated inverters, since the switching patterns are random between each other, the DC input filter inductance is required to limit the recirculating current.

The inverter DC input is the main interface with the rest of the electrical system. The longest feeder run in the system is the DC power input line 8 from the battery 18 to the inverter 50. It is important to control the EMI emission created through this interface. With the federated approach, each inverter needs a dedicated filter sized for the respective switching pattern of the single inverter. The integrated approach proposed herein enables the incorporation of a common EMI filter 24 in a common mode/differential mode configuration for the group of inverters 50. The common EMI filter 24 is sized as a function of the interleaved inverter switching pattern, thereby enabling reductions in the weight and volume of the integrated EPU 110.

In the integrated approach proposed herein, all the inverters 50 are fed by a single DC power input line 8 via a common DC busbar 15. In case of an inverter failure, the failed inverter can be isolated by using the Active Short Circuit (ASC) method (in which power switches of the failed inverter are closed) to isolate other inverters (i.e., other motor controller channels) in case of failure of one inverter. The integrated solution proposed herein enables use of ASC per motor star to manage inverter failure; there is no need for opening a contactor or blowing a fuse per inverter. The integrated solution makes it possible to implement a fault-tolerant design with minimum power distribution.

In accordance with one embodiment, the embedded EPC 12 is a controller that is configured with respective software modules which enable the following functionalities: (a) motor speed loop; (b) pitch control loop; (c) motor current loop; (d) interleaving of the power signals output by the inverters 50; and (e) mode control.

In summary, the integrated solution proposed herein provides electric synergy by combining a common DC link capacitor, a single DC terminal, simplified DC power distribution, simplified wiring, and integrated speed/position sensor control.

FIGS. 7A through 7D are diagrams showing example implementations of motor/inverter cooling integration and governor/pump solutions.

Figure 7A:
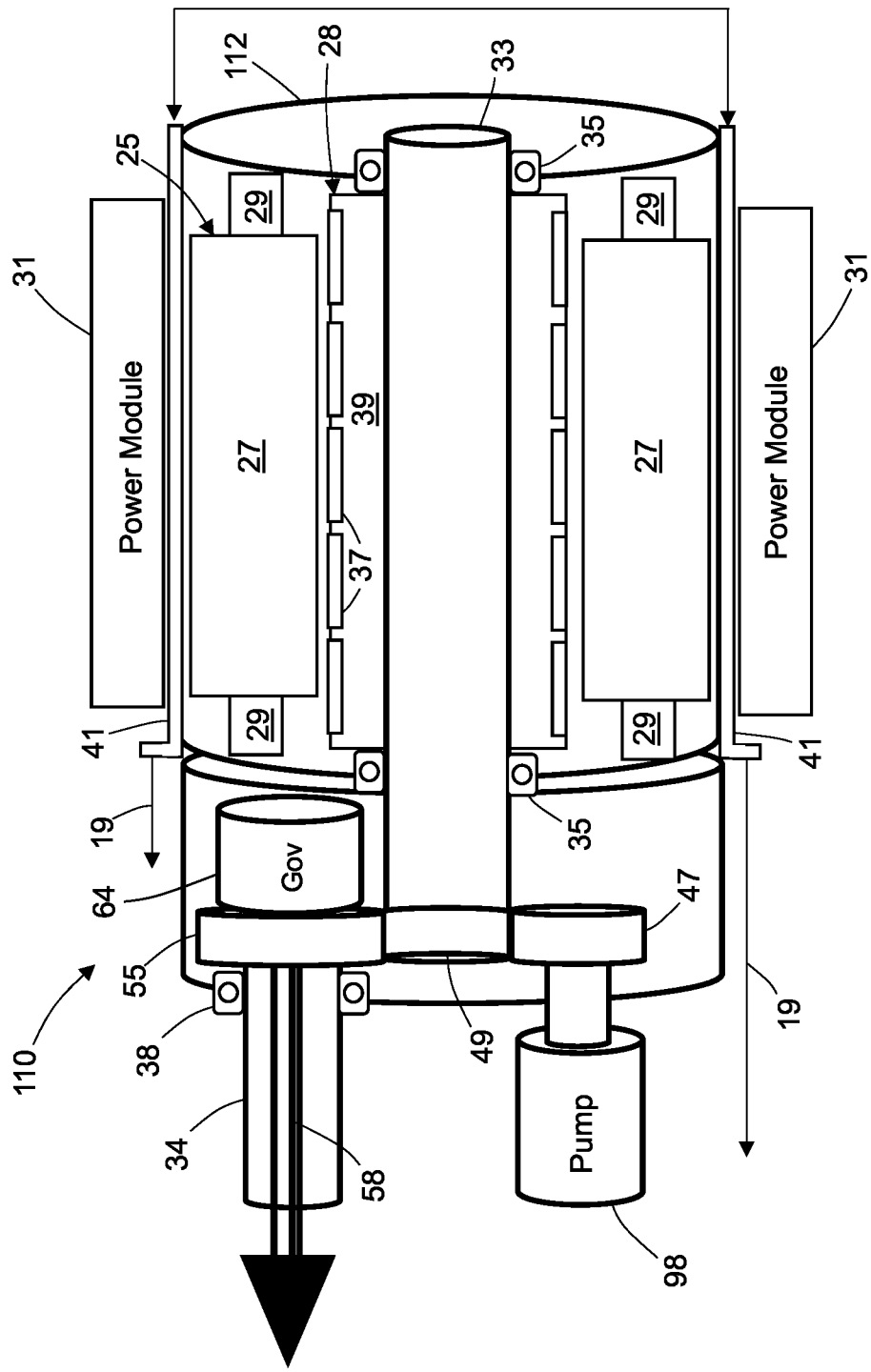
FIGS. 7A through 7D are diagrams showing example implementations of motor/inverter cooling integration and governor/pump solutions.

FIG. 7A depicts an integrated EPU 110 in which a motor shaft 33 is rotatably mounted inside the EPU housing 112 (only partly shown in FIG. 7A). The motor shaft 33 is supported by motor shaft bearings 35. The rotor core 39 of a rotor 28 is mounted on the hollow motor shaft 33 with a plurality of permanent magnets 37 arranged around its periphery. The rotor 28 is surrounded by a stator that includes a stator core 27 and stator windings 29. The stator 25 in turn is surrounded by a cooling jacket 41 having channels through which liquid coolant 19 flows (from right to left in FIG. 7A, as indicated by leftward-point arrows). The cooling jacket 41 is mounted to the back iron of stator 25. (The back iron is a housing radially outboard of the stator core.) A plurality of power modules 31 are mounted on the outer surface of cooling jacket 41, each power module including a respective inverter and inverter controller. The cooling jacket 41 is configured so that the liquid coolant 19 flowing through the channels of cooling jacket 41 cool both stator 25 and power modules 31.

Still referring to FIG. 7A, the EPU 110 further includes a main drive gear 49 mounted to the forward end of motor shaft 33. The teeth of the main drive gear 49 intermesh with the teeth of a pump drive gear 47 and the teeth of a propeller shaft drive gear 55, both of which are offset from a central axis of motor shaft 33. A pump 98, which pumps liquid coolant through the cooling jacket 41, has an input shaft that is attached to and driven to rotate by the pump drive gear 47. The propeller shaft drive gear 55 is mounted to a propeller shaft 34 which is hollow and offset from the motor shaft 33. The propeller shaft 34 is supported by a thrust bearing 38.

The gear set is adapted to reduce the speed of rotation of propeller shaft 34 relative to the speed of rotation of motor shaft 33 as part of the transmission subassembly. The governor 64 is behind the offset propeller shaft drive gear 55 and controls axial displacement of a beta rod 58 inside the hollow propeller shaft 34 to change the pitch of the propeller blades (not shown in FIG. 7A).

Figure 7B:
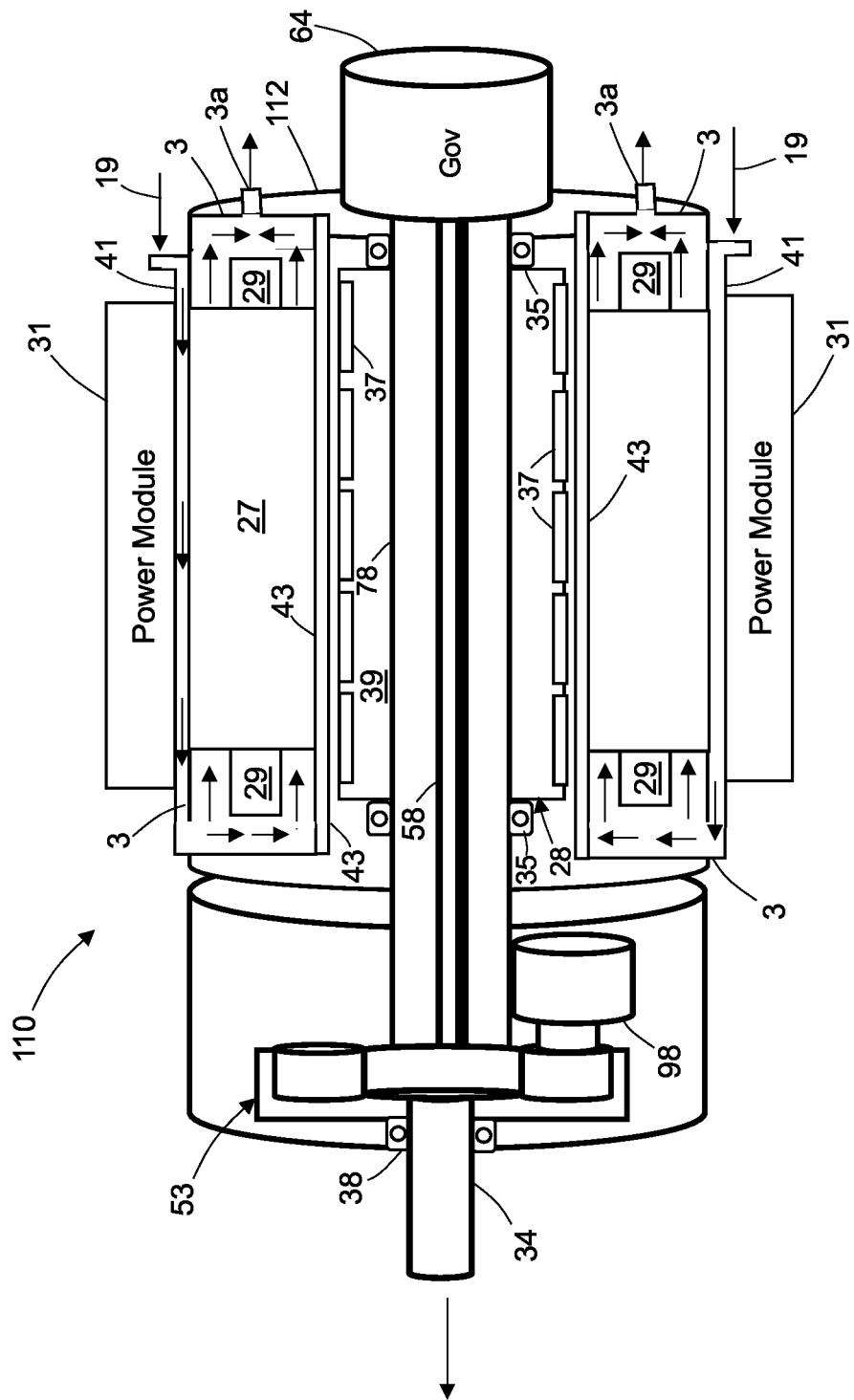

FIG. 7B depicts an EPU 110 in accordance with an alternative embodiment in which the stator 25 is cooled using a combination of jacket/back iron cooling and flooded stator solutions. More specifically, the outlet of a cooling jacket 41 is in fluid communication with stator internal cooling channels 3 having an outlet 3a. In the case of a flooded stator, the stator windings 29 are immersed in the cooling fluid to provide direct efficient cooling. The stator 25 has a stator housing 43 (a.k.a. back iron) that defines stator internal cooling channels 3 which enable the cooling fluid to circulate directly through the winding slots formed in the stator core 27. In a similar way to the configuration shown in FIG. 7A, the power modules 31 are directly mounted in the cooling jacket 41. The example implementation depicted in FIG. 7B uses a planetary gearbox 53 to allow the hollow motor shaft 78 to spin faster than the propeller shaft 34, with the governor 64 mounted to the aft face of the EPU housing 112 and the beta rod 58 extending the length of the EPU 110. Additionally, pump 98 is connected to a planet gear in the planetary gearbox 53

Figure 7C:
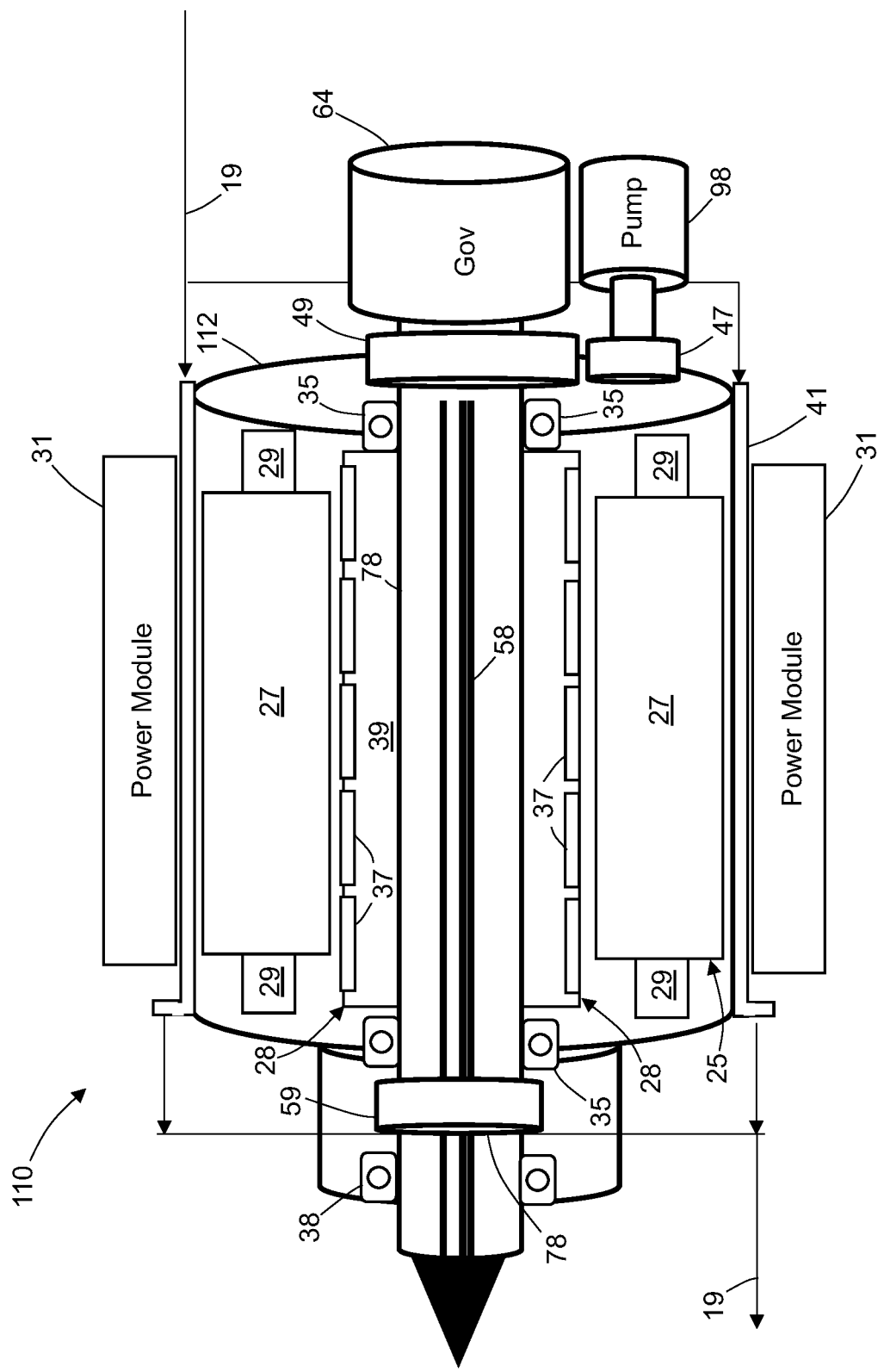

The motor configuration shown in FIG. 7C is similar to the motor configuration shown in FIG. 7B, except that the pump 98 is geared to the hollow motor shaft 78 at the back of the motor 30 using a gear set. The motor transmission element is configured as direct drive without a speed reducer. Optionally, a mechanical coupling 59 may be incorporated.

Figure 7D:
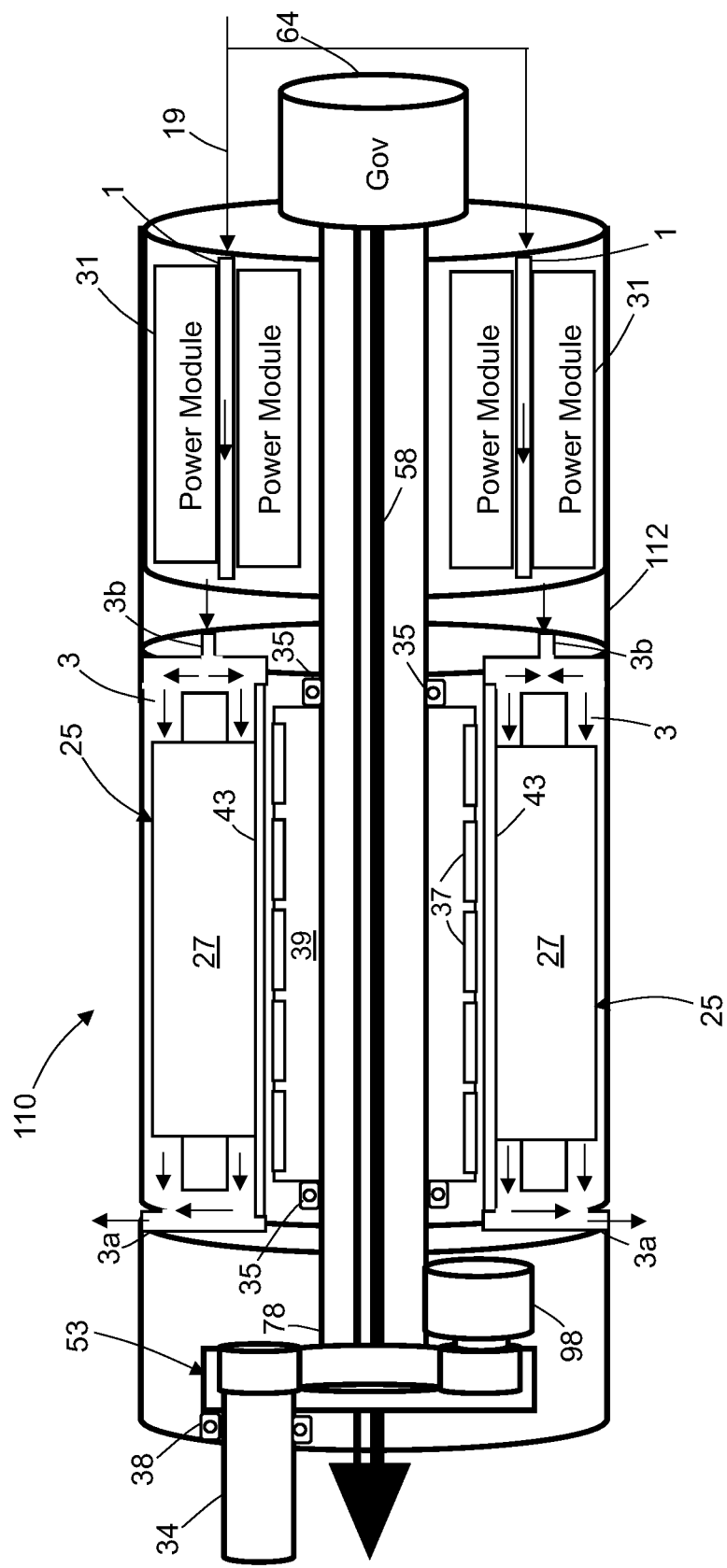

FIG. 7D depicts an EPU 110 in accordance with a further embodiment in which the stator 25 is cooled using flooded stator cooling. As was the case for the embodiment depicted in FIG. 7B, the stator internal cooling channels 3 are formed in part by the stator housing 43. Each stator internal cooling channels 3 has an inlet 3b and an outlet 3a. In the case of a flooded stator, the stator windings 29 are immersed in the cooling fluid to provide direct efficient cooling for the motor. The power modules 31 are located adjacent to the motor end winding compartment at the back of the motor. For each power module 31, liquid coolant (e.g., oil) flows through a respective cool plate 1 for cooling the inverter components (power switches, capacitors, etc.). The oil first flows through the cold plate 1 and then is directed through the slots (not shown in FIG. 7D) in the stator core 27. In this manner, one inverter and its associated motor star are arranged to receive liquid coolant in series. In this manner, individual Inverter/motor star pairs are arranged in parallel such that the cooling flow is split.

For all the configurations depicted in FIGS. 7A-7D, the thrust bearing 38 is cooled in parallel with the main cooling channel and scavenging is provided by an additional integrated pump element (not shown in FIGS. 7A-7D). Governor oil pressure is provided from the main flow by using a boost integrated pump element. For simplification, the oil sump is not depicted in FIGS. 7A-7D, but is integrated within the EPU package. The governor location is shown in the back of the motor, but could also be located in the front with different types of governor such as the counterweight type.

To improve electric propulsion system availability, state-of-the-art architecture relies on using two redundant individual electric propulsion channels (A/B) to drive the propeller 32. The main drawback is the duplication of numerous components such as housings, mechanical structure, cooling systems (pumps, sumps, etc.), bearings, shafts, and controllers. Additionally, the coordination between the two different channels can be difficult to implement as well as the integration with components such as the governor 64. The duplication of components increases the weight and volume of redundant electric propulsion systems.

Figure 8A:
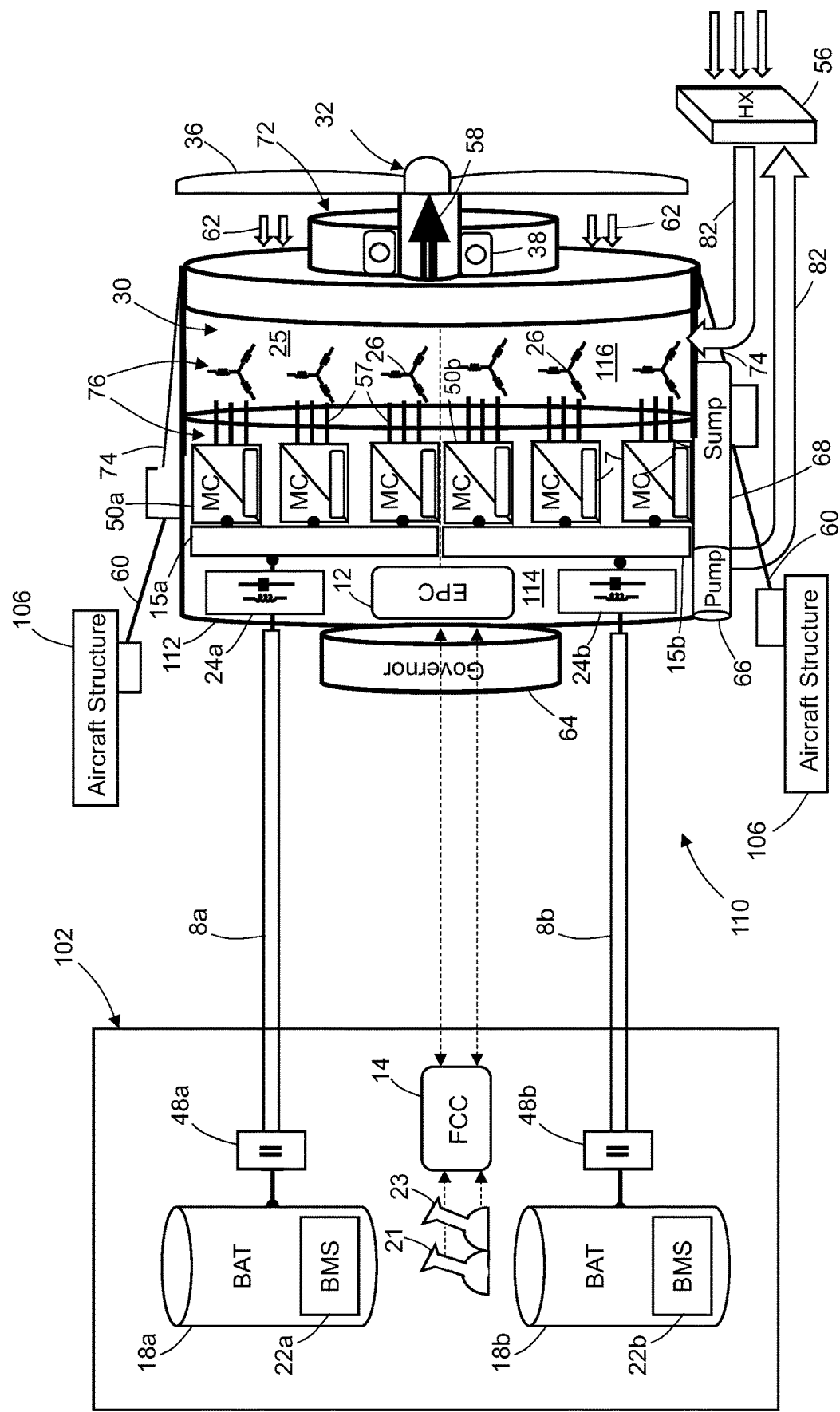
FIG. 8A is a diagram showing an overview of an electric propulsion unit with multiple channel integration in accordance with another embodiment.

In contrast, an integrated EPU enables to the development of an optimized redundant electric propulsion architecture. A dual-channel integrated EPU package can regroup two individual electric propulsion channels. FIG. 8A is a diagram showing an overview of an integrated EPU 110 with multiple channel integration in accordance with one embodiment. The motor controller channel A includes three inverters 50a which receive DC power from a battery 18a via a battery contactor 48a, a DC power input line 8a, an EMI filter 24a, and a low-inductance busbar 15a connected in series. The battery 18a is managed by a battery management system 22a. Similarly, the motor controller channel B includes three inverters 50b which receive DC power from a battery 18b via a battery contactor 48b, a DC power input line 8b, an EMI filter 24b, and a low-inductance busbar 15b connected in series. The battery 18b is managed by a battery management system 22b.

For the integrated EPU 110 depicted in FIG. 8A, the cooling system can be mutualized between the two channels using the same pump and sump circuit. The mechanical structure and housing can be integrated inside a single package to minimize weight and volume. Similar to the single-channel package, electrical interconnections between the motor 30 and inverters 50 are done directly through small busbars 57 to eliminate large AC wires. The EPU housing 112 is connected to the aircraft primary structure 106 by the integrated mechanical mounting point 74 and the nacelle to react the propeller loads and torque. The governor 64 and transmission (not shown in FIG. 8A) are integrated in the back and front of the package respectively. Two independent power electronics compartments are created for motor controller channel A and motor controller channel B.

Figure 8B:
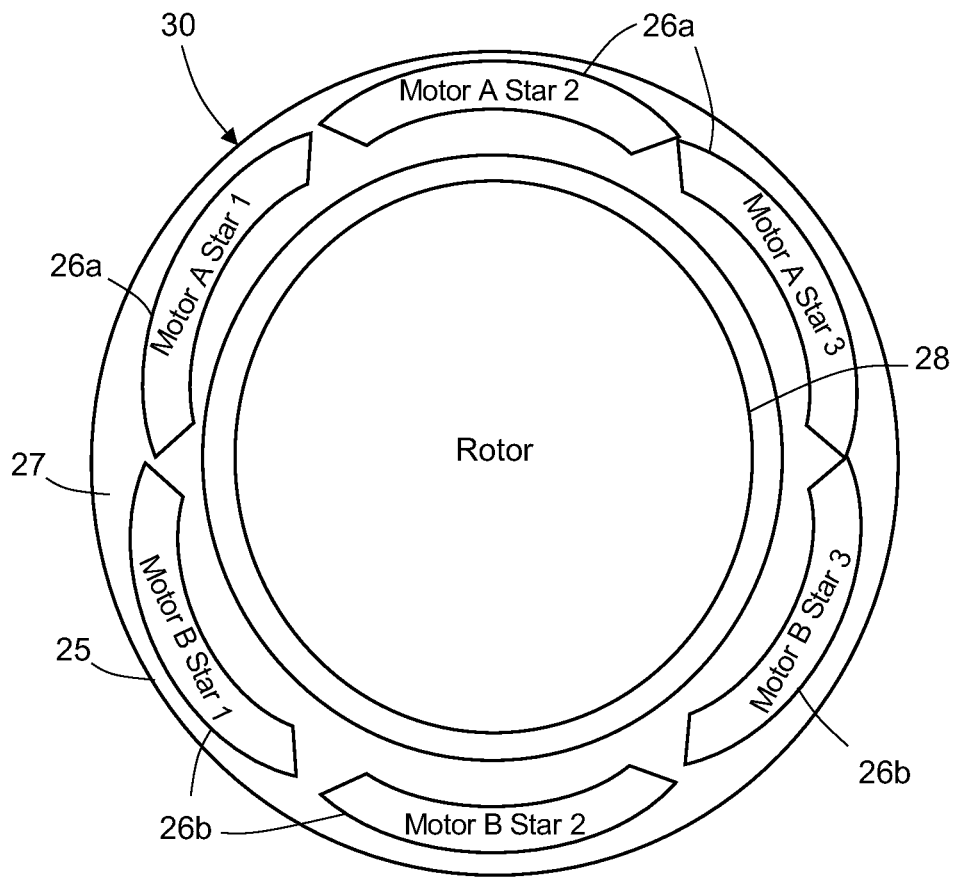
FIG. 8B is a diagram showing an integrated multi-phase fault-tolerant motor design for the electric propulsion unit depicted in FIG. 8A.

FIG. 8B is a diagram showing an integrated multi-phase fault-tolerant motor design for the electric propulsion unit depicted in FIG. 8A. Motor channel A and motor channel B can be implemented by an integrated multi-phase fault-tolerant motor design. The motor design is done to magnetically and electrically isolate each motor star from each other (and more particularly, to isolate the motor stars 26a for motor channel A from the motor stars 26b for motor channel B). Special winding strategies (e.g., concentrated winding), winding placement (stator location), and motor pitch and slot design can be used to achieve minimal magnetic and electric coupling between the motor stars of motor channels A and B. Additionally, the motor stars 26a for motor channel A are thermally isolated from the motor stars 26b for motor channel A because of the stator layout. The integrated motor in this example embodiment will have three motor stars 26a for motor channel A and three motor stars 26b for motor channel B. The proposed design will implement a common stator core 27 for motor channels A and B. It will also communalize the rotor elements (shaft, magnet, bearing, etc.) between motor channel A and motor channel B.

In case of failure of a motor star in motor channel A (or B), the impacted star A (or B) will be shorted using the active short circuit (ASC) strategy by closing the power switches in the inverter of the associated motor controller channel A (or B). The stator slots and winding scheme are sized to achieve ~1 PU impedance to limit the short-circuit current to the maximum rated current. In that condition, during ASC the losses in the failed motor star will be equal to the nominal losses. At nominal speed, the motor star connected to the short-circuited power switches creates a minimal drag torque and the healthy motor stars will be capable to keep driving the propeller.

In case of failure in the motor channel A distribution (or B), all the inverters in the associated motor channel A will be commanded to close one or both rows of power switches (3 or 6 switches) to effectively short circuit all of the motor stars in the failed motor channel. In that case, the motor channel A will not feed energy into the short circuits in the inverters. At nominal speed, all the motor stars in motor channel A (or B) short circuited will create minimal drag torque and motor channel B (or A) will be capable to keep driving the propeller.

The integrated multi-phase fault-tolerant motor design described above enables implementation of two independent motor functions without duplicating sizeable components such as stator magnetic cores, rotor magnets, shafts, bearings, housings, and support structure. The proposed solution optimizes weight and cost. Redundant motor functions are achieved without mechanical clutches or disconnect.

To limit the control complexity, a single EPC can be used for both motor controller channels A/B to command the different inverters and coordinate the control between both motor channels A/B. The EPC is integrated with the power electronics compartment in a manner similar to the single-package configuration depicted in FIG. 6.

Figure 9B:
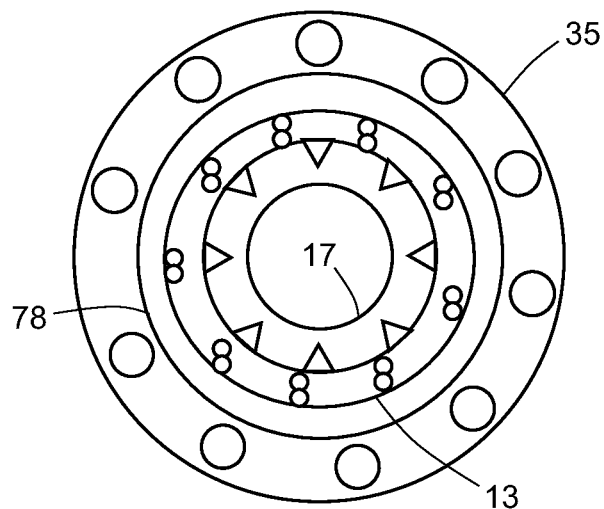
FIG. 9B is a diagram representing an end view of the concentric shaft arrangement in the dual-motor electric propulsion unit depicted in FIG. 9A.
Figure 9A:
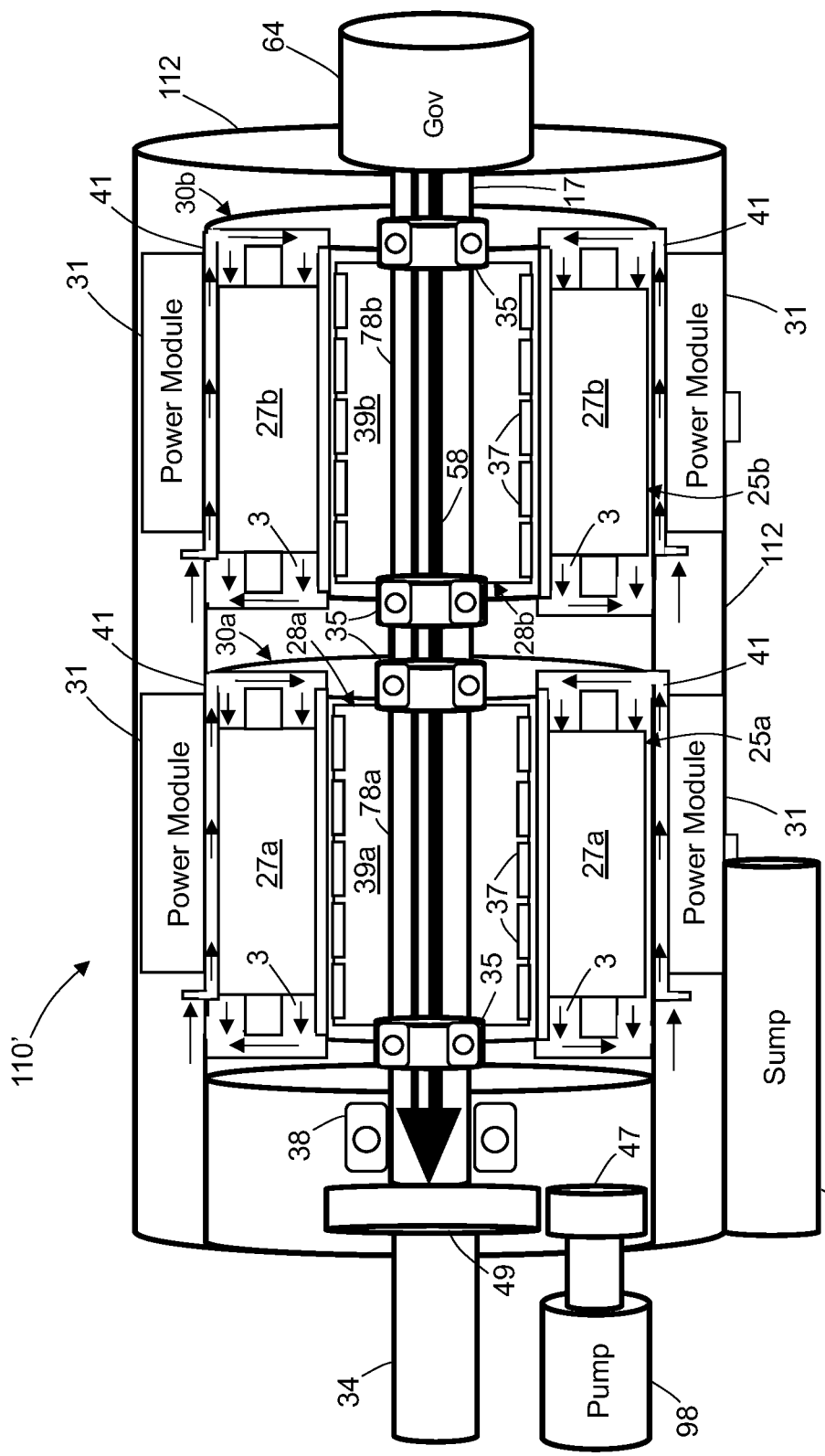
FIG. 9A is a diagram showing a partly sectioned view of a dual-motor electric propulsion unit with driveline integration in accordance with a further embodiment.

FIG. 9A is a diagram showing an overview of a dual-motor EPU 110' with driveline integration in accordance with a further embodiment. The dual-motor EPU 110' includes a first motor 30a disposed in a forward section of the EPU housing 112 and a second motor 30b disposed in an aft section of the EPU housing 112. The first motor 30a includes a hollow motor shaft 78a, a rotor core 39a mounted to and surrounding the hollow motor shaft 78a, and a stator core 27a surrounding the rotor core 39a. The second motor 30b includes a hollow motor shaft 78b, a rotor core 39b mounted to and surrounding the hollow motor shaft 78b, and a stator core 27b surrounding the rotor core 39b. Both motors are arranged in line axially. The illustrated solution integrates the power electronics with each motor to actively share the cooling between power modules 31 and stator cores 27a and 27b.

The hollow motor shafts 78a and 78b in turn are selectively coupled to and surround respective sections of a hollow main driveline shaft 17. The beta rod 58 is axially translatable inside the hollow main driveline shaft 17. The hollow motor shafts 78a and 78b are coupled to the hollow main driveline shaft 17 using respective sets of mechanical coupling devices 13, one of which is partly depicted in FIG. 9B. The mechanical coupling device 13 can be an over-riding clutch, a synchro-self-shifting clutch, or a sprag clutch type. The triangles in FIG. 9B represent spline interfaces between mechanical coupling device 13 and hollow main driveline shaft 17. Each motor 30a and 30b includes a respective set of motor shaft bearings 35 mounted to the EPU housing 112 to independently support the rotors 28a and 28b. Thus, when both hollow motor shafts 78a and 78b are coupled to hollow main driveline shaft 17, both motors 30a and 30b drive rotation of hollow main driveline shaft 17.

In alternative scenarios, if hollow motor shaft 78a is decoupled from hollow main driveline shaft 17 while hollow motor shaft 78b remains coupled, then only motor 30b drives rotation of hollow main driveline shaft 17, whereas if hollow motor shaft 78b is decoupled from hollow main driveline shaft 17 while hollow motor shaft 78a remains coupled, then only motor 30a drives rotation of hollow main driveline shaft 17. Accordingly, if one of the motors has failed, its mechanical coupling device 13 will disengage the rotor of the failed motor. The rotor of the failed motor will come to a standstill and the associated stator winding will be de-energized. The healthy motor can continue to operate and rotate without any impact from the failed motor. The use of mechanical disconnect enables independent disengagement of either motor in case of failure or abnormal operations. One significant difference from the proposed solution depicted in FIG. 8A is that the failed motor rotor is put at standstill and no back electromotive force is generated. Because of this feature, the failed motor and electronics do not have to continuously carry the short-circuit current. When a failure is detected in one motor, the associated inverter is commanded to initiate the ASC mode, in automatic response to which the rotor starts to slow down and mechanically disengage. During ASC, torque is increasing as the speed of the motor decreases. Once the rotor reaches zero speed, the ASC state is maintained until the rotor has a zero speed. The healthy motor continues to rotate and drive the propeller independently from the failed motor. The motor and inverter will have to sustain the short circuit only during the deceleration phase of the failed motor rotor (a few seconds). This will enable decreases in the weight and size of the motor magnetic/electric components and the size of the power switches.

Thus, the main tradeoff is using a mechanical disconnect device instead of adopting a high-impedance motor design. However, a hybrid solution can combine both approaches. In case of failure of a single motor star in motor 30a, the failed motor star will be put in the ASC mode. The two remaining motor stars for motor 30a will keep operating and driving. Motor 30b will also keep operating normally. If two or more motor stars fail or distribution is short circuited in motor 30a, motor 30a will be disengaged (all motor stars in the ASC mode) and motor 30b will keep operating normally. The hybrid approach may also enable redundancy for the motor disconnect function for safety purposes.

Figure 9C:
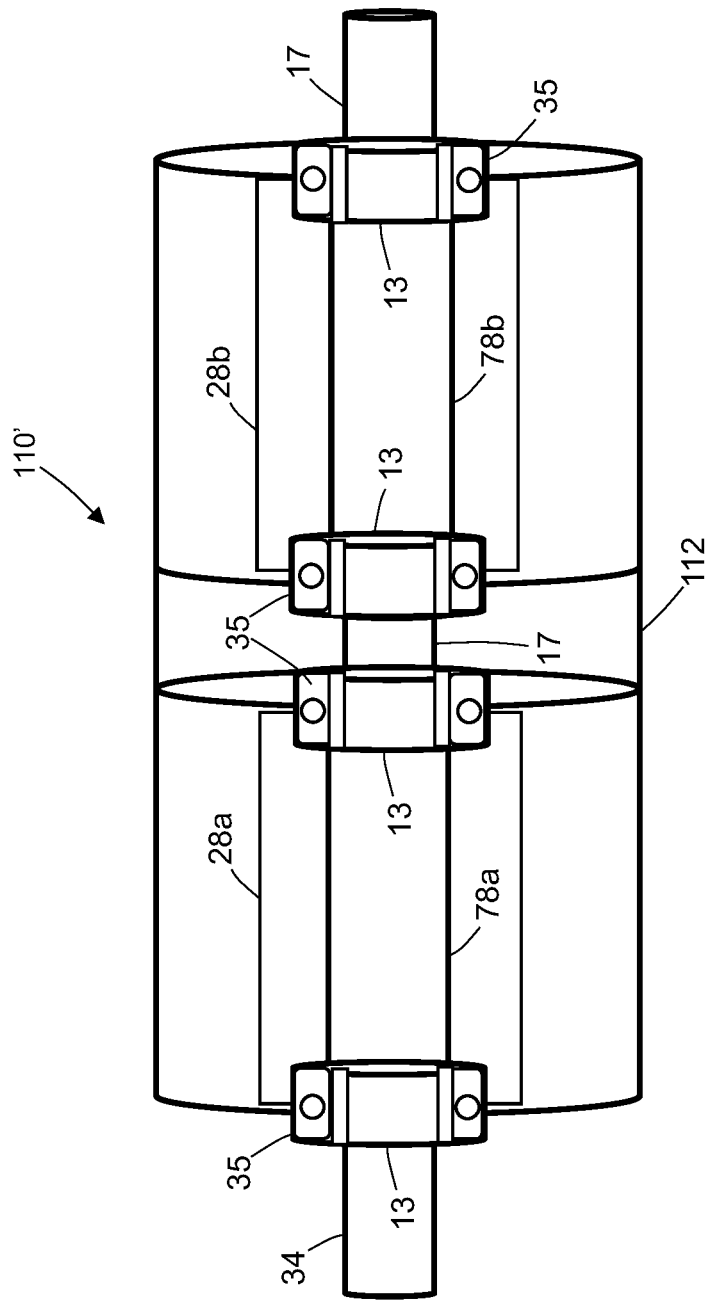
FIG. 9C is a diagram showing integration of the driveline in the dual-motor electric propulsion unit depicted in FIG. 9A.

The mechanical coupling devices 13 (which may be selectively actuated to perform a disconnect function) can be tightly integrated with the motor shaft bearings 35 (as depicted in FIG. 9C) to minimize the weight and size impact of adding a disconnect device in each motor. More specifically, the inner wall of the bearing and the outer wall of the clutch can be the same part, resulting in a reduced part count, reduced complexity, and fewer failure modes. The mechanical coupling device 13 can also be used to disconnect both motors 30a and 30b simultaneously from the main driveline shaft 17 in case of a failure such as over-speed or a mechanical failure such as bearing failure or rotor bottom down.

The solution proposed herein is easily scalable with multiple motor inverter modules stackable by means of mechanically coupling with the main driveline shaft 17. The example presented with two motors can be easily extended to three or more motors. The individual motors can be designed with minimum impedance or with ~1 PU impedance depending on the safety and isolation approach selected. Alternatively, it is also possible to stack multiple motors, each with ~1 PU impedance, with direct coupling (without the mechanical coupling device) if mechanical disconnect is not required.

The flowcharts and block diagrams in the different depicted embodiments illustrate the architecture, functionality, and operation of some possible implementations of apparatus and methods in an illustrative embodiment. In this regard, each block in the flowcharts or block diagrams may represent a module, segment, function, and/or a portion of an operation or step. For example, one or more of the blocks may be implemented as program code, in hardware, or a combination of the program code and hardware. When implemented in hardware, the hardware may, for example, take the form of integrated circuits that are manufactured or configured to perform one or more operations in the flowcharts or block diagrams.

The embodiments disclosed above use one or more controllers. Such devices typically include a processor or computer, such as a central processing unit, a microprocessor, a reduced instruction set computer processor, an application specific integrated circuit, a programmable logic circuit, a field-programmable gate array, a digital signal processor, and/or any other circuit or processing device capable of executing the functions described herein. The methods described herein may be encoded as executable instructions embodied in a non-transitory tangible computer-readable storage medium, including, without limitation, a storage device and/or a memory device. Such instructions, when executed by a controller, cause the controller to perform at least a portion of the methods described herein.

The methods described herein may be encoded as executable instructions embodied in a non-transitory tangible computer-readable storage medium, including, without limitation, a storage device and/or a memory device. Such instructions, when executed by a processing or computing system, cause the system device to perform at least a portion of the methods described herein.

While integrated electric propulsion units for aircraft have been described with reference to various embodiments, it will be understood by those skilled in the art that various changes may be made and equivalents may be substituted for elements thereof without departing from the scope of the teachings herein. In addition, many modifications may be made to adapt the teachings herein to a particular situation without departing from the scope thereof. Therefore it is intended that the claims not be limited to the particular embodiments disclosed herein.

The invention claimed is:

1. An electric propulsion unit comprising:
a housing comprising a back end plate;
an AC motor disposed inside the housing and comprising a plurality of bearings supported inside the housing, a hollow motor shaft rotatably coupled to the housing by the plurality of bearings, a stator which is supported by the housing, and a rotor which is mounted to the hollow motor shaft, wherein the stator comprises first, second, and third sets of windings;
a hollow propeller shaft connected to one end of the hollow motor shaft;
a beta rod which is axially translatable inside the hollow motor shaft and hollow propeller shaft;
first and second inserts which are affixed inside the hollow motor shaft and configured to support the beta rod while allowing the beta rod to slide axially;
a propeller mechanically coupled to the hollow propeller shaft, the propeller comprising propeller blades having an adjustable pitch angle which depends on an axial position of the beta rod;
a governor mounted to the back end plate of the housing and configured to adjust a pitch angle of the propeller blades by actuating axial translation of the beta rod;
first, second, and third inverters disposed inside the housing and connected to receive DC power for conversion into AC power which is supplied to the first, second, and third sets of windings respectively; and
first, second, and third cooling channels disposed inside the housing, wherein each of the first, second, and third cooling channels has a first cooling channel section that is thermally coupled to a respective one of the first, second, and third inverters and a second cooling channel section that is thermally coupled to a respective one of the first, second, and third sets of windings and is in fluid communication with the first cooling channel section.

2. The electric propulsion unit as recited in claim 1, wherein the first cooling channel section is a cold plate.

3. The electric propulsion unit as recited in claim 1, wherein the stator comprises a stator housing and the second cooling channel section is defined in part by the stator housing.

4. The electric propulsion unit as recited in claim 1, further comprising:
a first manifold disposed inside the housing and in fluid communication with the first cooling channel sections of the first, second, and third cooling channels;
a second manifold disposed inside the housing and in fluid communication with the second cooling channel sections of the first, second, and third cooling channels; and
a first return channel disposed inside the housing and in fluid communication with the second manifold.

5. The electric propulsion unit as recited in claim 4, further comprising:
a sump mounted to the housing and in fluid communication with the first return channel; and
a first pump mounted to the housing and in fluid communication with the sump.

6. The electric propulsion unit as recited in claim 5, wherein the first pump is geared to the hollow motor shaft.

7. The electric propulsion unit as recited in claim 5, further comprising:
a thrust bearing which supports the hollow propeller shaft;
a bearing lubrication channel disposed inside the housing and in fluid communication with the thrust bearing and the first manifold;
a second pump mounted to the housing and in fluid communication with the sump; and
a scavenging channel disposed inside the housing and in fluid communication with the thrust bearing and the second pump.

8. The electric propulsion unit as recited in claim 7, wherein the first and second pumps are geared to the hollow motor shaft.

9. The electric propulsion unit as recited in claim 7, further comprising:
a third pump mounted to the housing and in fluid communication with the sump;
a governor pressurized oil channel disposed inside the housing and in fluid communication with the governor and the third pump; and
a second return channel disposed inside the housing and in fluid communication with the governor and the sump.

10. An electric propulsion system comprising a nacelle and an electric propulsion unit installed inside the nacelle, wherein the electric propulsion unit comprises:
a housing;
an AC motor disposed inside the housing and comprising a plurality of bearings supported inside the housing, a motor shaft rotatably coupled to the housing by the plurality of bearings, a stator which is supported by the housing, and a rotor which is mounted to the motor shaft, wherein the stator comprises first, second, and third sets of windings;
a propeller shaft connected to one end of the motor shaft;
a propeller mounted to the propeller shaft and comprising propeller blades having an adjustable pitch angle;
first, second, and third inverters disposed inside the housing and connected to receive DC power for conversion into AC power which is supplied to the first, second, and third sets of windings respectively;
first, second, and third controllers disposed inside the housing and configured to control operation of the first, second, and third inverters respectively; and
a cooling circuit configured to guide a flow of circulating liquid, wherein the cooling circuit comprises:
a sump mounted to the housing;
a cooling pump mounted to the housing, geared to the motor shaft, and in fluid communication with the sump; and
first, second, and third cooling channels disposed inside the housing and connected to guide the circulating liquid from the cooling pump along first, second, and third flow paths respectively toward the sump,
wherein each of the first, second, and third cooling channels has a first cooling channel section that is thermally coupled to a respective one of the first, second, and third inverters and a second cooling channel section that is thermally coupled to a respective one of the first, second, and third sets of windings and is in fluid communication with the first cooling channel section.

11. The electric propulsion system as recited in claim 10, wherein the electric propulsion unit further comprises:
a first manifold disposed inside the housing and in fluid communication with the first cooling channel sections of the first, second, and third cooling channels;
a second manifold disposed inside the housing and in fluid communication with the second cooling channel sections of the first, second, and third cooling channels; and
a return channel disposed inside the housing and in fluid communication with the second manifold and the sump.

12. The electric propulsion unit as recited in claim 10, wherein the cooling pump is geared to the motor shaft.

13. The electric propulsion system as recited in claim 12, further comprising a heat exchanger disposed outside the housing and inside the nacelle and in fluid communication with the cooling pump and the first manifold.

14. An electric propulsion system comprising a nacelle and an electric propulsion unit installed inside the nacelle, wherein the electric propulsion unit comprises:
a housing comprising a back end plate;
an AC motor disposed inside the housing and comprising a plurality of bearings supported inside the housing, a hollow motor shaft rotatably coupled to the housing by the plurality of bearings, a stator which is supported by the housing, and a rotor which is mounted to the hollow motor shaft;
a hollow propeller shaft connected to one end of the hollow motor shaft;
a thrust bearing which supports the hollow propeller shaft;
a beta rod which is axially translatable inside the hollow motor shaft and hollow propeller shaft;
a propeller mechanically coupled to the hollow propeller shaft, the propeller comprising propeller blades having an adjustable pitch angle which depends on an axial position of the beta rod;
a governor mounted to the back end plate of the housing and configured to adjust a pitch angle of the propeller blades by actuating axial translation of the beta rod;
an inverter disposed inside the housing and connected to receive DC power for conversion into AC power;
a plurality of pumps disposed outside the housing and inside the nacelle;
a sump disposed outside the housing and inside the nacelle; and
an oil distribution system disposed inside the housing, thermally coupled to the inverter and the stator, and in fluid communication with the plurality of pumps, the governor, the thrust bearing, and the sump.

15. The electric propulsion system as recited in claim 14, wherein the oil distribution system comprises:
a cooling channel disposed inside the housing and having a first cooling channel section that is thermally coupled to the inverter and a second cooling channel section that is thermally coupled to the stator, the second cooling channel section being in fluid communication with the first cooling channel section;
a manifold disposed inside the housing and in fluid communication with the first cooling channel section; and
a first return channel disposed inside the housing and in fluid communication with the second cooling channel section and the sump.

16. The electric propulsion system as recited in claim 15, further comprising:
a heat exchanger disposed outside the housing and inside the nacelle and in fluid communication with the manifold,
wherein the plurality of pumps comprises a first pump which is in fluid communication with the sump and the heat exchanger.

17. The electric propulsion system as recited in claim 16, wherein the first pump is geared to the hollow motor shaft.

18. The electric propulsion system as recited in claim 16, further comprising:
a bearing lubrication channel disposed inside the housing and in fluid communication with the thrust bearing and the manifold; and
a scavenging channel disposed inside the housing and in fluid communication with the thrust bearing,
wherein the plurality of pumps further comprises a second pump which is in fluid communication with the sump and the scavenging channel.

19. The electric propulsion system as recited in claim 18, further comprising:
a governor pressurized oil channel disposed inside the housing and in fluid communication with the governor; and
a second return channel disposed inside the housing and in fluid communication with the governor and the sump, wherein the plurality of pumps further comprises a third pump which is in fluid communication with the manifold and the governor pressurized oil channel.

* * * * *